US010432152B2

(12) United States Patent
Watts et al.

(10) Patent No.: US 10,432,152 B2
(45) Date of Patent: Oct. 1, 2019

(54) RF AMPLIFIER OUTPUT CIRCUIT DEVICE WITH INTEGRATED CURRENT PATH, AND METHODS OF MANUFACTURE THEREOF

(71) Applicant: FREESCALE SEMICONDUCTOR, INC., Austin, TX (US)

(72) Inventors: Michael E. Watts, Scottsdale, AZ (US); Jeffrey K. Jones, Chandler, AZ (US); Ning Zhu, Chandler, AZ (US); Iouri Volokhine, Plaisance-du-Touch (NL)

(73) Assignee: NXP USA, Inc., Austin, TX (US)

( * ) Notice: Subject to any disclaimer, the term of this patent is extended or adjusted under 35 U.S.C. 154(b) by 421 days.

(21) Appl. No.: 14/919,990

(22) Filed: Oct. 22, 2015

(65) Prior Publication Data
US 2016/0344353 A1 Nov. 24, 2016

(30) Foreign Application Priority Data
May 22, 2015 (WO) .................. PCT/IB2015/000963

(51) Int. Cl.
*H03F 1/56* (2006.01)
*H03F 3/195* (2006.01)
(Continued)

(52) U.S. Cl.
CPC ......... *H03F 1/565* (2013.01); *H01F 27/2804* (2013.01); *H01G 4/005* (2013.01);
(Continued)

(58) Field of Classification Search
CPC .......... H01G 4/30; H01G 4/385; H01G 4/005; H01G 4/12; H01G 4/38; H03F 1/565;
(Continued)

(56) References Cited

U.S. PATENT DOCUMENTS 3,434,070 A 3/1969 Bartnik et al.
3,908,105 A 9/1975 Schuler
(Continued)

FOREIGN PATENT DOCUMENTS

CN 101296347 A 10/2008
CN 102340288 A 2/2012
(Continued)

OTHER PUBLICATIONS

Kahn, "Multilayer Ceramic Capacitors—Materials and Manufacture", Technical Information, AVX, Sep. 5, 2000, 8 pages.
(Continued)

*Primary Examiner* — Matthew L Reames
*Assistant Examiner* — Benjamin T Liu
(74) *Attorney, Agent, or Firm* — Sherry W. Schumm

(57) ABSTRACT

A device includes multiple ceramic capacitors and a current path structure. A first ceramic capacitor includes a first ceramic material between first and second electrodes. A second ceramic capacitor includes a second ceramic material between third and fourth electrodes. The second ceramic material has a higher Q than the first ceramic material. The current path structure includes a lateral conductor located between the first and second ceramic materials, and first and second vertical conductors that extend from first and second ends of the lateral conductor to a device surface. The device may be coupled to a substrate of a packaged RF amplifier device, which also includes a transistor. For example, the device may form a portion of an output impedance matching circuit coupled between a current carrying terminal of the transistor and an output lead of the RF amplifier device.

17 Claims, 9 Drawing Sheets

(51) Int. Cl.
  *H01G 4/30* (2006.01)
  *H01G 4/38* (2006.01)
  *H01L 23/66* (2006.01)
  *H01F 27/28* (2006.01)
  *H01G 4/005* (2006.01)
  *H01G 4/12* (2006.01)
  *H03F 3/213* (2006.01)
  *H03H 7/38* (2006.01)
  *H05K 1/11* (2006.01)
  *H01L 23/00* (2006.01)
  *H01G 4/40* (2006.01)

(52) U.S. Cl.
  CPC .......... *H01G 4/12* (2013.01); *H01G 4/30* (2013.01); *H01G 4/38* (2013.01); *H01G 4/385* (2013.01); *H01L 23/66* (2013.01); *H01L 24/00* (2013.01); *H01L 24/49* (2013.01); *H03F 3/195* (2013.01); *H03F 3/213* (2013.01); *H03H 7/38* (2013.01); *H05K 1/111* (2013.01); *H01F 2027/2809* (2013.01); *H01G 4/40* (2013.01); *H01L 2223/6611* (2013.01); *H01L 2223/6655* (2013.01); *H01L 2223/6661* (2013.01); *H01L 2224/05553* (2013.01); *H01L 2224/4811* (2013.01); *H01L 2224/48091* (2013.01); *H01L 2224/48137* (2013.01); *H01L 2224/49175* (2013.01); *H01L 2924/00014* (2013.01); *H01L 2924/00015* (2013.01); *H03F 2200/222* (2013.01); *H03F 2200/451* (2013.01); *H05K 2201/1003* (2013.01); *H05K 2201/10015* (2013.01); *H05K 2201/10022* (2013.01); *H05K 2201/10166* (2013.01)

(58) Field of Classification Search
  CPC .... H03F 2200/451; H03F 3/195; H03F 3/213; H01L 24/00; H01L 24/49; H01L 23/66; H05K 1/111; H01F 27/2804; H03H 7/38
  See application file for complete search history.

(56) References Cited

U.S. PATENT DOCUMENTS

| | | | |
|---|---|---|---|
| 3,908,185 A | 9/1975 | Martin | |
| 4,717,884 A | 1/1988 | Mitzlaff | |
| 5,066,925 A | 11/1991 | Freitag | |
| 5,229,732 A | 7/1993 | Furutani et al. | |
| 5,276,406 A * | 1/1994 | Samay | H03F 3/1935 330/277 |
| 5,625,528 A * | 4/1997 | Devoe | H01G 4/38 257/E23.004 |
| 5,736,901 A | 4/1998 | Nakamura | |
| 5,808,527 A | 9/1998 | De Los Santos | |
| 6,072,211 A | 6/2000 | Miller et al. | |
| 6,072,238 A | 6/2000 | Viswanathan et al. | |
| 6,072,690 A * | 6/2000 | Farooq | H01G 4/30 257/E23.067 |
| 6,081,160 A | 6/2000 | Custer et al. | |
| 6,222,425 B1 | 4/2001 | Okada et al. | |
| 6,507,101 B1 | 1/2003 | Morris | |
| 6,731,174 B2 | 5/2004 | Krvavac | |
| 6,734,728 B1 | 5/2004 | Leighton et al. | |
| 6,822,321 B2 | 11/2004 | Crescenzi | |
| 7,029,971 B2 | 4/2006 | Borland | |
| 7,057,464 B2 | 6/2006 | Bharj | |
| 7,135,643 B2 | 11/2006 | Van Haaster et al. | |
| 7,368,668 B2 | 5/2008 | Ren et al. | |
| 7,372,334 B2 | 5/2008 | Blair et al. | |
| 7,412,007 B1 | 8/2008 | Richley et al. | |
| 7,564,303 B2 | 7/2009 | Perugupalli et al. | |
| 7,733,059 B2 | 6/2010 | Yoshida | |
| 8,030,763 B2 | 10/2011 | Romero et al. | |
| 8,253,495 B2 | 8/2012 | Bouisse | |
| 8,324,728 B2 | 12/2012 | Tabrizi | |
| 8,350,367 B2 | 1/2013 | Chiu et al. | |
| 8,611,459 B2 | 12/2013 | McCallister | |
| 8,659,359 B2 | 2/2014 | Ladhani et al. | |
| 9,106,187 B2 | 8/2015 | Ladhani et al. | |
| 9,190,965 B2 | 11/2015 | Ladhani et al. | |
| 9,300,254 B2 | 3/2016 | Shah et al. | |
| 9,438,184 B2 | 9/2016 | Jones et al. | |
| 9,571,044 B1 | 2/2017 | Ning et al. | |
| 9,692,363 B2 | 6/2017 | Ning et al. | |
| 9,748,185 B2 | 8/2017 | Lakshminarayan et al. | |
| 9,762,185 B2 | 9/2017 | Ladhani et al. | |
| 9,979,356 B2 | 5/2018 | Holmes et al. | |
| 10,153,738 B2 | 12/2018 | Ladhani et al. | |
| 10,199,991 B2 | 2/2019 | Ladhani et al. | |
| 2004/0201422 A1 | 10/2004 | Goss | |
| 2005/0083118 A1 | 4/2005 | Baaker | |
| 2005/0083723 A1 | 4/2005 | Blednov et al. | |
| 2007/0024358 A1 | 2/2007 | Perugupalli et al. | |
| 2007/0029662 A1 | 2/2007 | Lee | |
| 2007/0090515 A1 | 4/2007 | Condie et al. | |
| 2007/0158787 A1 | 7/2007 | Chanchani | |
| 2007/0235855 A1 | 10/2007 | Bokatius et al. | |
| 2007/0273449 A1 | 11/2007 | Wilson | |
| 2008/0231373 A1 | 9/2008 | Rahman et al. | |
| 2008/0246547 A1 | 10/2008 | Blednov | |
| 2009/0130544 A1 | 5/2009 | Chang et al. | |
| 2009/0184756 A1 | 7/2009 | Blair et al. | |
| 2010/0038111 A1 | 2/2010 | Yabe et al. | |
| 2011/0031571 A1 | 2/2011 | Bouisse | |
| 2011/0156203 A1 | 6/2011 | Park | |
| 2012/0019334 A1 | 1/2012 | Hirai et al. | |
| 2012/0146723 A1 | 6/2012 | Blednov et al. | |
| 2012/0153391 A1 | 6/2012 | Rotay | |
| 2012/0154053 A1 | 6/2012 | Blair | |
| 2013/0033325 A1 | 2/2013 | Ladhani et al. | |
| 2014/0022020 A1 | 1/2014 | Aaen et al. | |
| 2014/0070365 A1 * | 3/2014 | Viswanathan | H01L 23/49589 257/531 |
| 2014/0077881 A1 | 3/2014 | Wilson | |
| 2014/0167855 A1 | 6/2014 | Ladhani et al. | |
| 2014/0167863 A1 | 6/2014 | Ladhani et al. | |
| 2014/0179243 A1 | 6/2014 | Bouisse et al. | |
| 2014/0225672 A1 | 8/2014 | Wilson et al. | |
| 2014/0333385 A1 | 11/2014 | Gutta et al. | |
| 2015/0115893 A1 | 4/2015 | Lee et al. | |
| 2015/0235933 A1 | 8/2015 | Ladhani et al. | |
| 2015/0263681 A1 | 9/2015 | Embar et al. | |
| 2016/0344353 A1 | 11/2016 | Watts et al. | |

FOREIGN PATENT DOCUMENTS

| | | |
|---|---|---|
| JP | 09-283700 | 10/1997 |
| JP | 2005-110119 | 4/2005 |
| JP | 2006-041285 A | 2/2006 |
| JP | 2007-285875 A | 11/2007 |
| JP | 2008-175804 A | 7/2008 |
| JP | 2003-115732 | 4/2018 |
| WO | 00/075990 A1 | 12/2000 |
| WO | 182672 A1 | 11/2001 |
| WO | 2006/016299 A1 | 2/2006 |
| WO | 2009130544 A1 | 10/2009 |
| WO | 2010038111 A1 | 4/2010 |

OTHER PUBLICATIONS

U.S. Appl. No. 14/316,484, filed Jun. 26, 2014, entitled "Radio Frequency Devices With Surface-Mountable Capacitors for Decoupling and Methods Thereof".

Non-Final Office Action dated Jan. 4, 2013 for U.S. Appl. No. 12/746,793, 10 pages.

Non-Final Office Action dated May 28, 2013 for U.S. Appl. No. 12/746,793, 9 pages.

Notice of Allowance dated Oct. 10, 2013 for U.S. Appl. No. 12/746,793, 7 pages.

Non-Final Office Action dated Jul. 7, 2014 for U.S. Appl. No. 14/185,291, 15 pages.

(56) References Cited

OTHER PUBLICATIONS

Notice of Allowance dated Mar. 5, 2015 for U.S. Appl. No. 14/185,291, 7 pages.
Notice of Allowance dated Oct. 29, 2014 for U.S. Appl. No. 14/185,291, 6 pages.
Non-Final Office Action dated Aug. 11, 2014 for U.S. Appl. No. 14/185,382, 12 pages.
Non-Final Office Action dated Dec. 29, 2014 for U.S. Appl. No. 14/185,382, 9 pages.
Notice of Allowance dated May 29, 2015 for U.S. Appl. No. 14/185,382, 5 pages.
Notice of Allowance dated Oct. 29, 2015 for U.S. Appl. No. 13/611,793, 9 pages.
Restriction Requirement dated Oct. 25, 2013 for U.S. Appl. No. 13/611,793, 5 pages.
Non-Final Office Action dated Dec. 6, 2013 for U.S. Appl. No. 13/611,793, 14 pages.
Final Office Action dated Sep. 4, 2014 for U.S. Appl. No. 13/611,793, 14 pages.
U.S. Appl. No. 14/317,572, filed Jun. 27, 2014, entitled "Integrated Passive Device Assemblies for RF Amplifiers, and Methods of Manufacture Thereof".
U.S. Appl. No. 14/573,927, filed Dec. 17, 2014, entitled "Magnetically Coupled Load Modulation".
U.S. Appl. No. 14/919,511, filed Oct. 21, 2015 entitled "RF Power Transistors With Video Bandwidth Circuits, and Methods of Manufacture Thereof".
U.S. Appl. No. 14/919,513, filed Oct. 21, 2015 entitled "RF Power Transistors With Impedance Matching Circuits, and Methods of Manufacture Thereof".
Notice of Allowance dated Apr. 21, 2017 for U.S. Appl. No. 14/942,419 11 pages.
Notice of Allowance dated May 15, 2017 for U.S. Appl. No. 14/919,511 5 pages.
Non-Final Office Action dated Nov. 2, 2015 for U.S. Appl. No. 14/317,572, 10 pages.
Notice of Allowance dated Apr. 19, 2017 for U.S. Appl. No. 15/050,176 8 pages.
lotice of Allowance dated Nov. 9, 2016 for U.S. Appl. No. 14/942,419 12 pages.
lotice of Allowance dated Mar. 6, 2017 for U.S. Appl. No. 14/942,419 5 pages.
Final Office Action dated Oct. 14, 2016 for U.S. Appl. No. 15/050,176 9 pages.
Non-Final Office Action dated Apr. 22, 2016 for U.S. Appl. No. 15/050,176 9 pages.
Notice of Allowance dated Feb. 13, 2017 for U.S. Appl. No. 15/050,176 7 pages.
Non-Final Office Action dated Nov. 2, 2016 for U.S. Appl. No. 14/919,511 5 pages.
Notice of Allowance dated Feb. 27, 2017 for U.S. Appl. No. 14/919,511 7 pages.
Notice of Allowance dated Nov. 2, 2016 for U.S. Appl. No. 14/919,513 7 pages.
Non-Final Office Action dated Apr. 11, 2016 for U.S. Appl. No. 14/942,419 11 pages.
Notice of Allowance dated May 6, 2016 for U.S. Appl. No. 14/317,572 9 pages.
Extended European Search Report for Patent Appln. No. 16169901.2 (dated Oct. 4, 2016).
Non-Final Office Action dated Mar. 26, 2018 for U.S. Appl. No. 15/674,261, 8 pgs.
Non-Final Office Action dated Jan. 11, 2018 for U.S. Appl. No. 15/674,318, 9 pgs.
Notice of Allowance dated Sep. 25, 2018 for U.S. Appl. No. 15/674,261 8 pages.
Notice of Allowance dated Aug. 16, 2018 for U.S. Appl. No. 15/674,318 7 pages.
Non Final Office Action; U.S. Appl. No. 16/255,612; 13 pages (Jun. 26, 2019).

\* cited by examiner

RF AMPLIFIER OUTPUT CIRCUIT DEVICE WITH INTEGRATED CURRENT PATH, AND METHODS OF MANUFACTURE THEREOF

TECHNICAL FIELD

Embodiments of the subject matter described herein relate generally to packaged semiconductor devices, and more particularly to packaged, radio frequency (RF) semiconductor devices that include impedance matching circuits.

BACKGROUND

High power, radio frequency (RF) transistor devices are commonly used in RF communication infrastructure amplifiers. These RF transistor devices typically include one or more input leads, one or more output leads, one or more transistors, one or more bias leads, and various bondwires coupling the leads to the transistor(s). In some cases, input and output circuits also may be contained within the same package that contains the device's transistor(s). More specifically, an in-package input circuit (e.g., including an input impedance matching circuit) may be coupled between a device's input lead and a control terminal (e.g., the gate) of a transistor, and an in-package output circuit (e.g., including an output impedance matching circuit) may be coupled between a current conducting terminal (e.g., the drain) of a transistor and a device's output lead.

Instantaneous signal bandwidth (ISBW) is becoming a major requirement for RF communication infrastructure amplifiers, and thus for the high-power RF transistor devices included in such amplifiers. Along with an impedance matching circuit, an RF device's output circuit also may include a baseband decoupling circuit configured to provide an RF ground down to envelope frequencies. Generally, the ISBW of the device is limited by the low frequency resonance (LFR) caused by interaction between the device's bias feeds and components of such a baseband decoupling circuit. In recent years, RF transistor devices have been developed with limited LFRs in the range of about 450 megahertz (MHz) or less, which supports ISBWs in the range of about 150 MHz or less. Although these devices are sufficient for some applications, the desire for wider RF bandwidth amplifiers continues to increase. Accordingly, high-power RF transistor devices are needed that include output circuits that are capable of higher LFRs and ISBWs, which support such wider RF bandwidth amplifiers.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
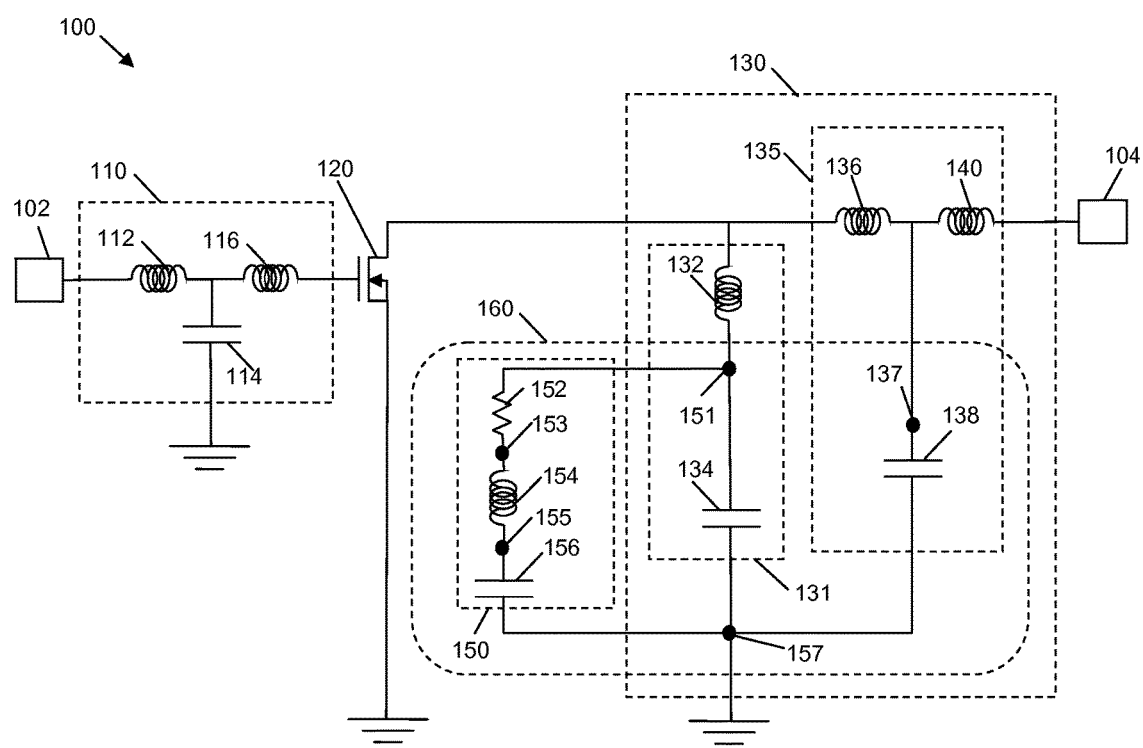
FIG. 1 is a schematic diagram of an RF amplifier with input and output circuits, in accordance with an example embodiment.

A conventional RF amplifier device includes an active device (e.g., a transistor), an input impedance matching circuit coupled between an input to the RF amplifier device and an input to the active device, and an output circuit (including an output impedance matching circuit) coupled between an output of the active device and an output of the RF amplifier device. Embodiments of RF amplifier devices discussed herein also include a baseband decoupling circuit in the output circuit, which is configured to provide an RF ground down to envelope frequencies. These RF amplifier device embodiments include output circuit components that may support wider RF bandwidth amplifiers than are achievable using conventional components, while meeting various performance requirements and other criteria. For example, assuming a 3:1 ratio of low frequency resonance (LFR) to instantaneous signal bandwidth (ISBW), embodiments may enable transmission of signals with a 200 megahertz (MHz) or above ISBW, which corresponds to low LFRs of approximately 600 MHz or greater. In other cases, the LFR to ISBW ratio could be from 2.4:1 to 5:1, depending on the system used for linearization (e.g., the digital pre-distortion (DPD) system).

In various embodiments, a baseband decoupling circuit with a relatively large capacitance value, referred to herein as an envelope capacitance or "$C_{env}$", is used to achieve an increased LFR (and thus increased ISBW). According to an embodiment, $C_{env}$ is implemented as a ceramic capacitor, which has a high capacitance value with a relatively small form factor. According to a further embodiment, $C_{env}$ may be coupled with (e.g., co-fired with) one or more other ceramic capacitors of the output circuit. In such an embodiment, $C_{env}$ includes relatively low quality factor (Q) (e.g., high dielectric constant), ceramic material between its electrodes, and the other ceramic capacitors include relatively high Q (e.g., low dielectric constant) ceramic material between their electrodes. Said another way, capacitors of the baseband decoupling circuit and the output impedance matching circuit are implemented in a ceramic device (referred to herein as "multi-dielectric ceramic device") that includes one or more first capacitors implemented in a dielectric material having a first Q, and one or more second capacitors implemented in a dielectric material having a different Q. Embodiments also include packaged RF transistor devices that include such multi-dielectric ceramic devices, and RF amplifiers that include such packaged RF transistor devices.

In a conventional high-power RF transistor device, the transistor and components of the output circuit are mounted on a conductive substrate or flange, and forward current between the transistor and the output lead is carried through bondwires between the transistor and the output lead. Reverse current, on the other hand, is carried in an opposite direction across the surface of the conductive substrate. In this configuration, eddy currents develop during operation in the space between the forward-current-carrying bondwires and the reverse-current-carrying substrate surface. In devices in which these eddy currents pass though low-Q material (e.g., high dielectric constant material) positioned between the forward and reverse current paths, the devices may experience significant power loss through the low-Q material at the carrier frequencies.

To overcome this issue, embodiments of the inventive subject matter include a current path structure that circumscribes the low Q material (e.g., dielectric materials included in $C_{env}$), thus substantially reducing or eliminating power losses through that low-Q material. In other words, the current path structure substantially eliminates the presence of relatively lossy low-Q material between the device's forward and return current paths. More specifically, in one embodiment, a "reverse current path structure" is configured to carry reverse current, and it is physically positioned between $C_{env}$ and the forward current path. In another embodiment, a "forward current path structure" is configured to carry forward current, and it is physically positioned between $C_{env}$ and the reverse current path.

As indicated above, an embodiment of a multi-dielectric ceramic device may include capacitors for both an envelope frequency termination circuit and an output impedance matching circuit, where the capacitors for each type of circuit include different Q factor materials between their respective electrodes. According to a further embodiment, the multi-dielectric ceramic devices include a current path structure located between the capacitor dielectrics, where the current path structure circumscribes the relatively low-Q material of $C_{env}$. The current path structure is configured to carry either reverse current or forward current, and to reduce or eliminate eddy currents (and thus losses) through the relatively low-Q material. This allows for a relatively high LFR (and thus a relatively wide ISBW), while reducing losses from eddy currents between the forward and reverse paths.

FIG. 1 is a schematic diagram of an RF amplifier device 100. Device 100 includes an input lead 102, an input impedance matching circuit 110, a transistor 120, an output impedance matching circuit 130, an envelope frequency termination circuit 150, and an output lead 104, in an embodiment. The output impedance matching circuit 130 and the envelope frequency termination circuit 150 may be referred to collectively as an "output circuit." Although transistor 120 and various elements of the input and output impedance matching circuits 110, 130 and the envelope frequency termination circuit 150 are shown as singular components, the depiction is for the purpose of ease of explanation only. Those of skill in the art would understand, based on the description herein, that transistor 120 and/or certain elements of the input and output impedance matching circuits 110, 130 and the envelope frequency termination circuit 150 each may be implemented as multiple components (e.g., connected in parallel or in series with each other), and examples of such embodiments are illustrated in the other Figures and described later. For example, embodiments may include single-path devices (e.g., including a single input lead, output lead, transistor, etc.), dual-path devices (e.g., including two input leads, output leads, transistors, etc.), and/or multi-path devices (e.g., including two or more input leads, output leads, transistors, etc.). Further, the number of input/output leads may not be the same as the number of transistors (e.g., there may be multiple transistors operating in parallel for a given set of input/output leads). The description of transistor 120 and various elements of the input and output impedance matching circuits 110, 130 and the envelope frequency termination circuit 150, below, thus are not intended to limit the scope of the inventive subject matter only to the illustrated embodiments.

Input lead 102 and output lead 104 each include a conductor, which is configured to enable the device 100 to be electrically coupled with external circuitry (not shown). More specifically, input and output leads 102, 104 are physically located between the exterior and the interior of the device's package. Input impedance matching circuit 110 is electrically coupled between the input lead 102 and a first terminal of transistor 120, which is also located within the device's interior, and output impedance matching circuit 130 and envelope frequency termination circuit 150 are electrically coupled between a second terminal of transistor 120 and the output lead 104.

According to an embodiment, transistor 120 is the primary active component of device 100. Transistor 120 includes a control terminal and two current conducting terminals, where the current conducting terminals are spatially and electrically separated by a variable-conductivity channel. For example, transistor 120 may be a field effect transistor (FET) (such as a metal oxide semiconductor FET (MOSFET)) or a high electron mobility transistor (HEMT), each of which includes a gate (control terminal), a drain (a first current conducting terminal), and a source (a second current conducting terminal). Alternatively, transistor 120 may be a bipolar junction transistor (BJT). Accordingly, references herein to a "gate," "drain," and "source," are not intended to be limiting, as each of these designations has analogous features for a BJT implementation (e.g., a base, collector, and emitter, respectively). According to an embodiment, and using nomenclature typically applied to MOSFETs in a non-limiting manner, the gate of transistor 120 is coupled to the input impedance matching circuit 110, the drain of transistor 120 is coupled to the output impedance matching circuit 130 and the envelope frequency termination circuit 150, and the source of transistor 120 is coupled to ground (or another voltage reference). Through the variation of control signals provided to the gate of transistor 120, the current between the current conducting terminals of transistor 120 may be modulated.

Input impedance matching circuit 110 is configured to raise the impedance of device 100 to a higher (e.g., intermediate or higher) impedance level (e.g., in a range from about 2 to about 10 Ohms or higher). This is advantageous in that it allows the printed circuit board level (PCB-level) matching interface from a driver stage to have an impedance that can be achieved in high-volume manufacturing with minimal loss and variation (e.g., a "user friendly" matching interface). Input impedance matching circuit 110 is coupled between the input lead 102 and the control terminal (e.g., gate) of the transistor 120. According to an embodiment, input impedance matching circuit 110 is a low pass circuit, which includes two inductive elements 112, 116 (e.g., two sets of bondwires) and a shunt capacitor 114. A first inductive element 112 (e.g., a first set of bondwires) is coupled between input lead 102 and a first terminal of capacitor 114, and a second inductive element 116 (e.g., a second set of bondwires) is coupled between the first terminal of capacitor 114 and the control terminal of transistor 120. The second terminal of capacitor 114 is coupled to ground (or another voltage reference). The combination of inductive elements 112, 116 and shunt capacitor 114 functions as a low-pass filter. According to an embodiment, the series combination of inductive elements 112, 116 may have a value in a range between about 50 picohenries (pH) to about 3 nanohenries (nH), and shunt capacitor 114 may have a value in a range between about 2 picofarads (pF) to about 100 pF.

Output impedance matching circuit 130 is configured to match the output impedance of device 100 with the input impedance of an external circuit or component (not shown) that may be coupled to output lead 104. Output impedance matching circuit 130 is coupled between the first current conducting terminal (e.g., drain) of transistor 120 and the output lead 104. According to an embodiment, output impedance matching circuit 130 includes three inductive elements 132, 136, 140 (e.g., three sets of bondwires) and two capacitors 134, 138. Output impedance matching circuit 130 includes a high-pass matching circuit 131 (including inductive element 132 and capacitor 134) and a low-pass matching circuit 135 (including inductive elements 136, 140 and capacitor 138), in an embodiment.

In the low-pass matching circuit 135, inductive elements 136, 140 (e.g., third and fourth sets of bondwires), also referred to herein as "$L_{LP1}$" and $L_{LP2}$", are coupled in series between the first current conducting terminal (e.g., drain) of transistor 120 and the output lead 104, with node 137 between inductive elements 136, 140. Capacitor 138, also referred to herein as "$C_{LP}$", has a first terminal coupled to node 137, and a second terminal coupled to a ground node 157, which in turn may be coupled to ground (or to another voltage reference). The combination of inductive elements 136, 140 and capacitor 138 functions as a first (low-pass) matching stage. According to an embodiment, the series combination of inductive elements 136, 140 may have a value in a range between about 40 pH to about 3 nH, and capacitor 138 may have a value in a range between about 2 pF to about 80 pF, although these components may have values outside of these ranges, as well.

Figure 11:
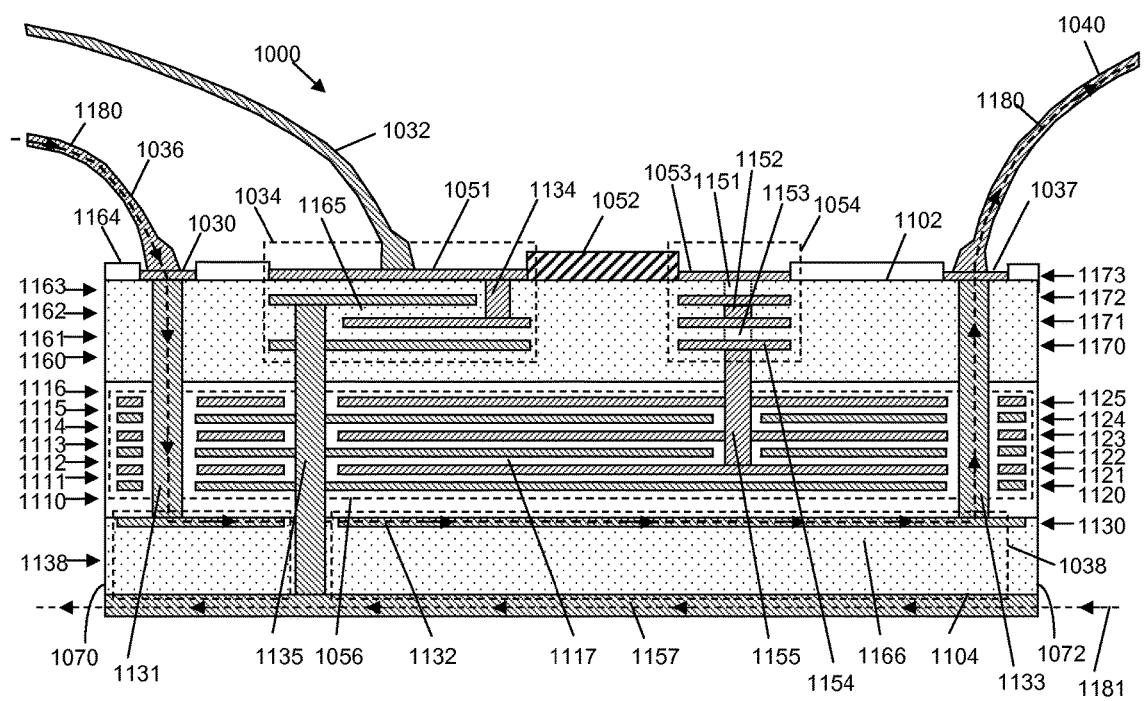
FIG. 11 is a cross-sectional, side view of the multi-dielectric ceramic device of FIG. 10 along line 11-11.

In an alternate embodiment, capacitor 138 may be replaced with a conductor-backed, low impedance transmission line, which includes a forward current carrying path (e.g., lateral conductor 1132, FIG. 11) and a ground plane (e.g., conductive layer 1157, FIG. 11) that are separated by a dielectric material (e.g., dielectric layer(s) 1138, FIG. 11). Because there would be some capacitive interaction between the forward current carrying path and the ground plane, such a conductor-backed transmission line theoretically could be referred to as a capacitor (or a ceramic capacitor when the dielectric material is a ceramic).

In the high-pass matching circuit 131, inductive element 132 (e.g., a fifth set of bondwires), also referred to as "$L_{shunt}$", is coupled between the first current conducting terminal of transistor 120 and a first terminal of capacitor 134, also referred to as "$C_{shunt}$". A second terminal of capacitor 134 is coupled to a ground node 157. The combination of inductive element 132 and capacitor 134 functions as a second (high-pass) matching stage. According to an embodiment inductive element 132 may have a value in a range between about 80 pH to about 3 nH, and capacitor 134 may have a value in a range between about 50 pF to about 500 pF, although these components may have values outside of these ranges, as well.

An RF "cold point" is present at the node 151 between inductive element 132 and capacitor 134, where the RF cold point represents a high impedance point in the circuit to signals having RF frequencies. Envelope frequency termination circuit 150 is coupled between the RF cold point (at node 151) and ground node 157, in an embodiment. Envelope frequency termination circuit 150 functions to improve the low frequency resonance of device 100 caused by the interaction between the output impedance matching circuit 130 and the bias feeds by presenting a high impedance at RF frequencies. Envelope frequency termination circuit 150 essentially is "invisible" from a matching standpoint, as it only effects the output impedance at envelope frequencies (i.e., envelope frequency termination circuit 150 provides terminations for the envelope frequencies of device 100).

According to an embodiment, envelope frequency termination circuit 150 includes a resistor 152, an inductance 154, and a capacitor 156 coupled in series. A first terminal of resistor 152, referred to herein as an "envelope resistor" or "$R_{env}$," is coupled to node 151 (i.e., the RF cold point). At node 153, a second terminal of envelope resistor 152 is coupled to a first terminal of inductance 154, revered to herein as an "envelope inductor" or "$L_{env}$." At node 155, a second terminal of inductance 154 is coupled to capacitor 156, referred to herein as an "envelope capacitor" or "$C_{env}$." A second terminal of the envelope capacitor 156 is coupled to the ground node 157, in an embodiment. Envelope resistor 152 may have a value in a range between about 0.1 Ohm to about 2 Ohm, envelope inductance 154 may have a value that is less than about 25-500 pH, and envelope capacitor 156 may have a value in a range between about 5 nanofarads (nF) to about 1 microfarad (µF), although these components may have values outside of these ranges, as well. Although envelope inductance 154 is shown to include a single lumped element in FIG. 1, envelope inductance 154 actually may be made up of one or more distinct inductors (e.g., inductor 754, 1054, FIGS. 7, 10) and additional small inductances associated with other conductive features (e.g., conductive vias and portions of conductive traces) present in the conductive path between RF cold point node 151 and ground node 157.

As will be described in more detail later, some or all of capacitors 134, 138, 156, envelope resistor 152, and envelope inductor 154 may be integrally formed portions of the aforementioned multi-dielectric ceramic device (e.g., multi-dielectric ceramic device 700, FIG. 7), as indicated by the dashed box 160 encompassing these components. At a minimum, the multi-dielectric ceramic device may include two capacitors (e.g., capacitors 134 and 156, or capacitors 156 and 138) with different dielectric materials between their respective electrodes. Inclusion of the third capacitor, inductor 154, and/or resistor 152 provide for increased integration of the components of the output circuit, with potential benefits in terms of smaller device size, lower device cost, and/or improved device performance.

Figure 2:
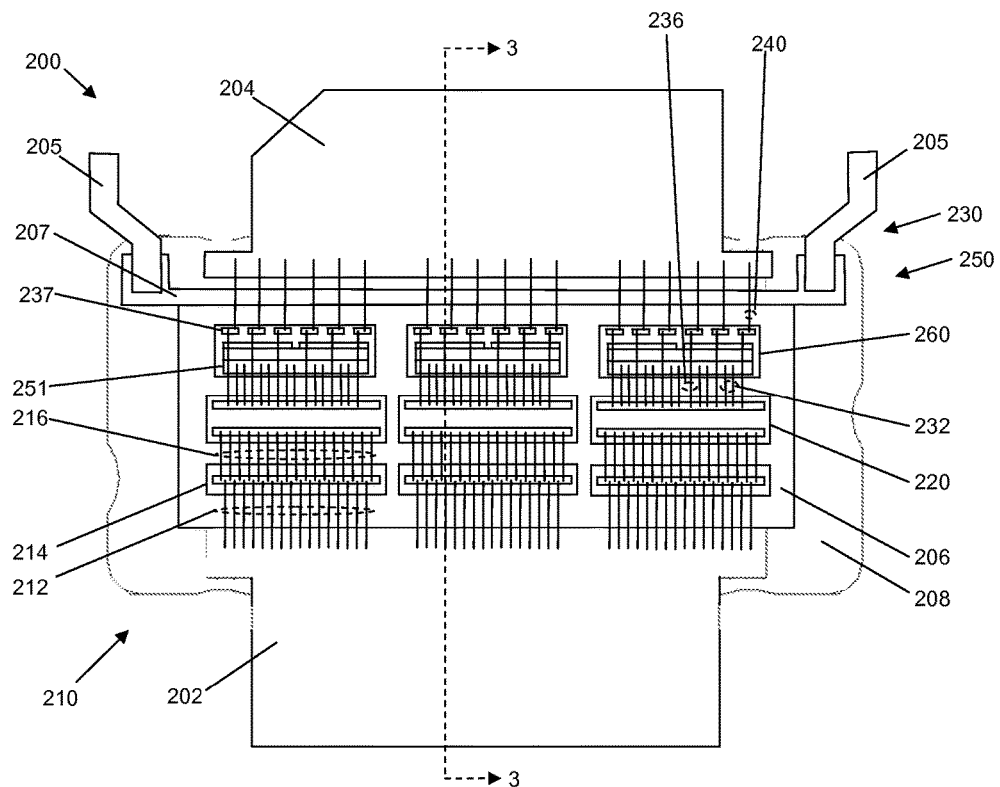
FIG. 2 is a top view of an example of a packaged RF amplifier device that embodies the circuit of FIG. 1, in accordance with an example embodiment.

FIG. 2 is a top view of an example of a packaged RF amplifier device 200 that embodies the circuit of FIG. 1, in accordance with an example embodiment. More particularly, the interconnected electrical components and elements of device 200 may be modeled by the schematic diagram of FIG. 1. For enhanced understanding, FIG. 2 should be viewed in parallel with FIG. 3, which is a cross-sectional, side view of the RF amplifier device 200 of FIG. 2 along line 3-3.

Device 200 includes an input lead 202 (e.g., input lead 102, FIG. 1), an output lead 204 (e.g., output lead 104, FIG. 1), bias leads 205, a flange 206, an isolation structure 208, and three parallel amplification paths (i.e., three parallel instantiations of circuit 100, FIG. 1) electrically coupled between the input and output leads 202, 204. Each amplification path includes an input impedance matching circuit 210 (e.g., input impedance matching circuit 110, FIG. 1), a transistor 220 (e.g., transistor 120, FIG. 1), an output impedance matching circuit 230 (e.g., output impedance matching circuit 130, FIG. 1), and an envelope frequency termination circuit 250 (e.g., envelope frequency termination circuit 150, FIG. 1). As will be described in more detail below, portions of the output impedance matching circuit 230 and the envelope frequency termination circuit 250 are implemented in a multi-dielectric ceramic device 260, in accordance with an embodiment.

Flange 206 includes a rigid electrically-conductive substrate, which has a thickness that is sufficient to provide structural support for other components and elements of device 200. In addition, flange 206 may function as a heat sink for transistors 220 and other devices mounted on flange 206. Flange 206 has a top and bottom surface and a substantially-rectangular perimeter that corresponds to the perimeter of the device 200. In FIG. 2, only a central portion of the top surface of flange 206 is visible through an opening in isolation structure 208. At least the surface of flange 206 is formed from a layer of conductive material, and possibly all of flange 206 is formed from bulk conductive material. Alternatively, flange 206 may have one or more layers of non-conductive material below its top surface. Either way, flange 206 has a conductive top surface. When device 200 is incorporated into a larger electrical system, flange 206 may be used to provide a ground reference for the device 200.

Isolation structure 208 is formed from a rigid, electrically insulating material (i.e., a material with a dielectric constant in a range from about 3.0 to about 10.0, although materials with higher or lower dielectric constants may be used), and has a top surface and an opposed bottom surface. The term "isolation structure," as used herein, refers to a structure that provides electrical isolation between conductive features of a device (e.g., between leads 202, 204 and flange 206). For example, isolation structure 208 may be formed from inorganic materials (e.g., ceramic such as aluminum oxide, aluminum nitride, and so on) and/or organic materials (e.g., one or more polymers or printed circuit board (PCB) materials). In an embodiment in which isolation structure 208 comprises PCB materials (e.g., the isolation structure 208 essentially includes a single or multi-layer PCB), conductive layers (e.g., copper layers) may be included on the top and bottom surfaces of the isolation structure. In a further embodiment, a conductive layer on the top surface of the isolation structure 208 may be patterned and etched to form a leadframe (including leads 202, 204) for the device 200, and a conductive layer on the bottom surface of the isolation structure 208 may be coupled to the flange 206. In other embodiments, conductive layers may be excluded from the top and/or bottom surface of the isolation structure 208. In such embodiments, leads (e.g., leads 202, 204) may be coupled to the isolation structure 208 using metallurgic connection or epoxy (or other adhesive materials), and/or the isolation structure 208 may be coupled to the flange 206 using metallurgic connection or epoxy (or other adhesive materials). In still other embodiments, the isolation structure 208 may be milled at the portion of its top surface to which a lead is attached.

Isolation structure 208 has a frame shape, in an embodiment, which includes a substantially enclosed, four-sided structure with a central opening. Isolation structure 208 may have a substantially rectangular shape, as shown in FIG. 2, or isolation structure 208 may have another shape (e.g., annular ring, oval, and so on). Isolation structure 208 may be formed as a single, integral structure, or isolation structure 208 may be formed as a combination of multiple members. For example, in an alternate embodiment, isolation structure 208 may include multiple portions that contact each other or that are spatially separated from each other (e.g., isolation structure 208 may have one portion isolating input lead 202 from flange 206, and another portion isolating output lead 204 from flange 206). In addition, isolation structure 208 may be formed from a homogenous material, or isolation structure 208 may be formed from multiple layers.

The input and output leads 202, 204 and the bias leads 205 are mounted on a top surface of the isolation structure 208 on opposed sides of the central opening, and thus the input and output leads 202, 204 and the bias leads 205 are elevated above the top surface of the flange 206, and are electrically isolated from the flange 206. For example, the leads 202, 204, 205 may be soldered or otherwise attached to metallization (not shown) on a top surface of isolation structure 208 (e.g., a metallurgic connection). Generally, the leads 202, 204, 205 are oriented in order to allow for attachment of bondwires (e.g., bondwires 212, 240) between the leads 202, 204, 205 and components and elements within the central opening of isolation structure 208.

According to an embodiment, bias leads 205 are electrically coupled together with a bar-shaped conductor 207, which also is coupled to the top surface of isolation structure 208. According to a particular embodiment, conductor 207 includes metallization on a top surface of isolation structure 208. Proximal ends of bias leads 205 are coupled to opposite ends of conductor 207, in an embodiment. Bondwires (not shown) are electrically coupled between conductor 207 and a bias point (e.g., cold point node 151, 251, FIGS. 1, 2).

Bias leads 205 extend from the device 200, once packaged, so that their distal ends are exposed and may be coupled to a PCB of a larger system to receive a bias voltage. Accordingly, inclusion of bias leads 205 eliminates the need for bias leads on the PCB itself. According to an embodiment, each bias lead 205 has a length corresponding to lambda/4, although each bias lead 205 may have a different length, as well. An advantage of including bias leads 205 as part of device 200 is that the bias leads 205 remove the need for quarter wave bias feeds, as additional large value de-coupling capacitors may be connected between the bias leads 205 and ground as the bias leads 205 exit the device package.

Another embodiment may include a four-lead device with an input lead, an output lead, and two bias leads coupled to the input impedance matching circuit. Yet another embodiment includes a six-lead device with an input lead, an output lead, two bias leads coupled to the output impedance matching circuit and two bias leads coupled to the input impedance matching circuit. In still other embodiments, only a single bias lead may be coupled to the input and/or output impedance matching circuits (e.g., particularly for embodiments in which there are more than two RF leads, such as in dual-path and multi-path devices).

Transistors 220 and various elements 214, 260 of the input and output impedance matching circuits 210, 230 and the envelope frequency termination circuit 250 are mounted on a generally central portion of the top surface of a flange 206 that is exposed through the opening in isolation structure 208. For example, the transistors 220 and elements 214, 260 of the input and output impedance matching circuits 210, 230 and the envelope frequency termination circuit 250 may be coupled to flange 206 using conductive epoxy, solder, solder bumps, sintering, and/or eutectic bonds. As used herein, an "active device area" corresponds to a portion of a device on which one or more active devices (e.g., transistor 220) are mounted (e.g., the portion of the conductive surface of flange 206 that exposed through the opening in isolation structure 208).

Each of transistors 220 has a control terminal (e.g., a gate) and two current conducting terminals (e.g., a drain and a source). The control terminal of each transistor 220 is coupled to the input lead 202 through an input impedance matching circuit 210 (e.g., input impedance matching circuit 110, FIG. 1). In addition, one current conducting terminal (e.g., the drain) of each transistor 220 is coupled to the output lead 204 through an output impedance matching circuit 230 (e.g., output impedance matching circuit 130, FIG. 1), and the other current conducting terminal (e.g., the source) is coupled to the flange 206 (e.g., to a ground reference node for the device 200).

In the device 200 of FIG. 2, each input impedance matching circuit 210 includes two inductive elements 212, 216 (e.g., inductive elements 112, 116, FIG. 1) and a capacitor 214 (e.g., capacitor 114, FIG. 1). Each inductive element 212, 216 is formed from a plurality of parallel, closely-spaced sets of bondwires. For example, a first inductive element 212 (e.g., inductive element 112, FIG. 1) includes a plurality of bondwires coupled between input lead 202 and a first terminal of capacitor 214 (e.g., capacitor 114, FIG. 1), and a second inductive element 216 (e.g., inductive element 116, FIG. 1) includes a plurality of bondwires coupled between the first terminal of capacitor 214 and the control terminal of transistor 220. The second terminal of capacitor 214 is coupled to the flange 206 (e.g., to ground). Capacitor 214 may be, for example, a discrete silicon capacitor (e.g., comprised of a silicon substrate with a top surface corresponding to a first terminal, and a bottom surface corresponding to a second terminal), a discrete ceramic capacitor, or another type of capacitor. Bondwires 212, 216 are attached to a conductive top plate at the top surface of capacitor 214.

In the device 200 of FIG. 2, each output impedance matching circuit 230 includes three inductive elements 232, 236, 240 (e.g., $L_{shunt}$ 132, $L_{LP1}$ 136, and $L_{LP2}$ 140, FIG. 1) and two capacitors (e.g., $C_{shunt}$ 134 and $C_{LP}$ 138, FIG. 1), where the capacitors form portions of multi-dielectric ceramic device 260, in an embodiment. Again, each inductive element 232, 236, 240 is formed from a plurality of parallel, closely-spaced sets of bondwires. For example, shunt inductive element 232 (e.g., $L_{shunt}$ 132, FIG. 1) includes a plurality of bondwires coupled between the first current conducting terminal (e.g., the drain) of transistor 220 and a first bond pad 251 (e.g., corresponding to RF cold point node 151, FIG. 1) on a top surface of the multi-dielectric ceramic device 260. The first bond pad 251 is electrically coupled to a shunt capacitor (e.g., $C_{shunt}$ 134, FIG. 1) within the multi-dielectric ceramic device 260. A first series inductive element 236 (e.g., $L_{LP1}$ 136, FIG. 1) includes a plurality of bondwires coupled between the first current conducting terminal of transistor 220 and a second bond pad 237 (e.g., corresponding to node 137, FIG. 1) on the top surface of the multi-dielectric ceramic device 260. The second bond pad 237 is electrically coupled to a low pass matching capacitor (e.g., $C_{LP}$ 138, FIG. 1) within the multi-dielectric ceramic device 260. Finally, a second series inductive element 240 (e.g., $L_{LP2}$ 140, FIG. 1) is coupled between the second bond pad 237 and the output lead 204. Second terminals of the shunt and LP-match capacitors within the multi-dielectric ceramic device 260 are coupled to the flange 206 (e.g., to ground).

According to an embodiment, device 200 is incorporated in an air cavity package, in which transistors 220 and various impedance matching and envelope frequency termination elements are located within an enclosed air cavity 312. Basically, the air cavity is bounded by flange 206, isolation structure 208, and a cap 310 overlying and in contact with the isolation structure 208 and leads 202, 204. In other embodiments, a device may be incorporated into an overmolded package (i.e., a package in which the electrical components within the active device area are encapsulated with a non-conductive molding compound, and in which portions of the leads 202, 204 also may be encompassed by the molding compound).

Figure 3:
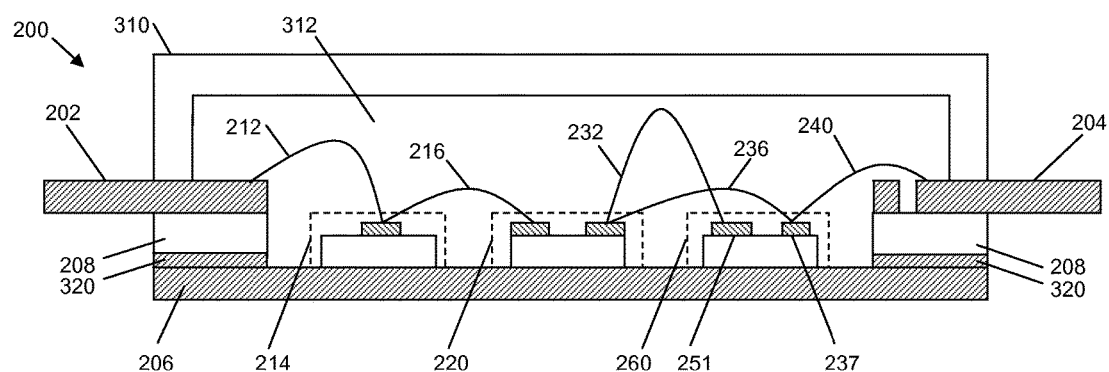
FIG. 3 is a cross-sectional, side view of the RF amplifier device of FIG. 2 along line 3-3.
Figure 4:
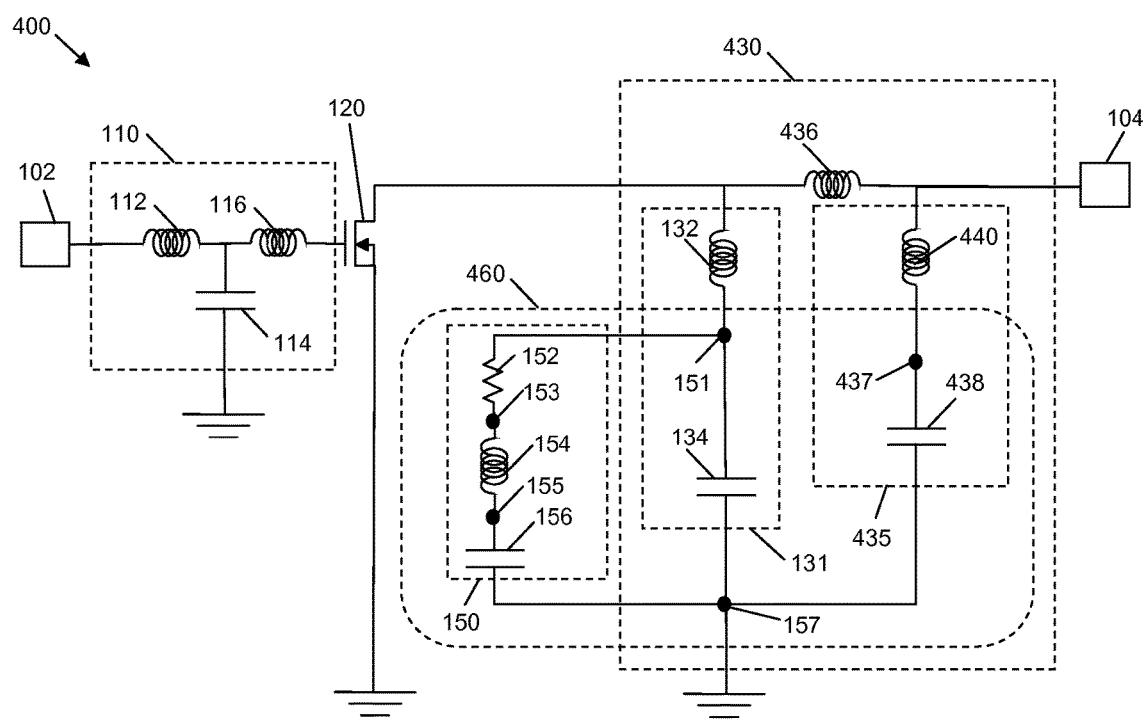
FIG. 4 is a schematic diagram of an RF amplifier with input and output circuits, in accordance with another example embodiment.

In the embodiments discussed in conjunction with FIGS. 1-3, the output impedance matching circuit 130, 230 includes a high-pass shunt circuit 131 and a low-pass, LP-match circuit 135 (e.g., including inductive elements 136, 140 or bondwires 236, 240 and capacitor 138). In an alternate embodiment, the low-pass matching circuit 135 may be replaced with a differently-configured matching circuit. For example, FIG. 4 is a schematic diagram of an RF amplifier 400 with a second matching circuit 435 (e.g., a low-pass matching circuit with a very high frequency resonance) forming a portion of its output impedance matching circuit 430, in accordance with another example embodiment. Except for the replacement of low-pass matching circuit 135 with matching circuit 435, and the replacement of inductive element 136 with inductive element 436, RF amplifier 400 may be substantially similar to the amplifier 100 of FIG. 1, and like reference numbers are used in both drawings to indicate elements that may be substantially the same between the two embodiments.

In device 400, inductive element 436, or "$L_{series}$", is coupled directly between the first current conducting terminal (e.g., drain) of transistor 120 and the output lead 104. In addition, the high-pass matching circuit 435, which includes a "bond back" or "BB" inductive element 440 coupled in series with a BB capacitor 438, is coupled between the output lead 104 and the ground node 152. More specifically, $L_{BB}$ 440 is coupled between the output lead 104 and a node 437, and $C_{BB}$ 438 is coupled between node 437 and the ground node 157. According to an embodiment, $L_{series}$ 436 may have a value in a range between about 50 pH to about 3 nH, $L_{BB}$ 440 may have a value in a range between about 50 pH to about 500 pH, and $C_{BB}$ 438 may have a value in a range between about 2 pF to about 50 pF, although these components may have values outside of these ranges, as well.

Some or all of capacitors 134, 438, 156, envelope resistor 152, and envelope inductor 154 may be integrally formed portions of the aforementioned multi-dielectric ceramic device (e.g., multi-dielectric ceramic device 700, FIG. 7), as indicated by the dashed box 460 encompassing these components. At a minimum, the multi-dielectric ceramic device may include two capacitors (e.g., capacitors 134 and 156, or capacitors 156 and 438) with different dielectric materials between their respective electrodes.

Figure 5:
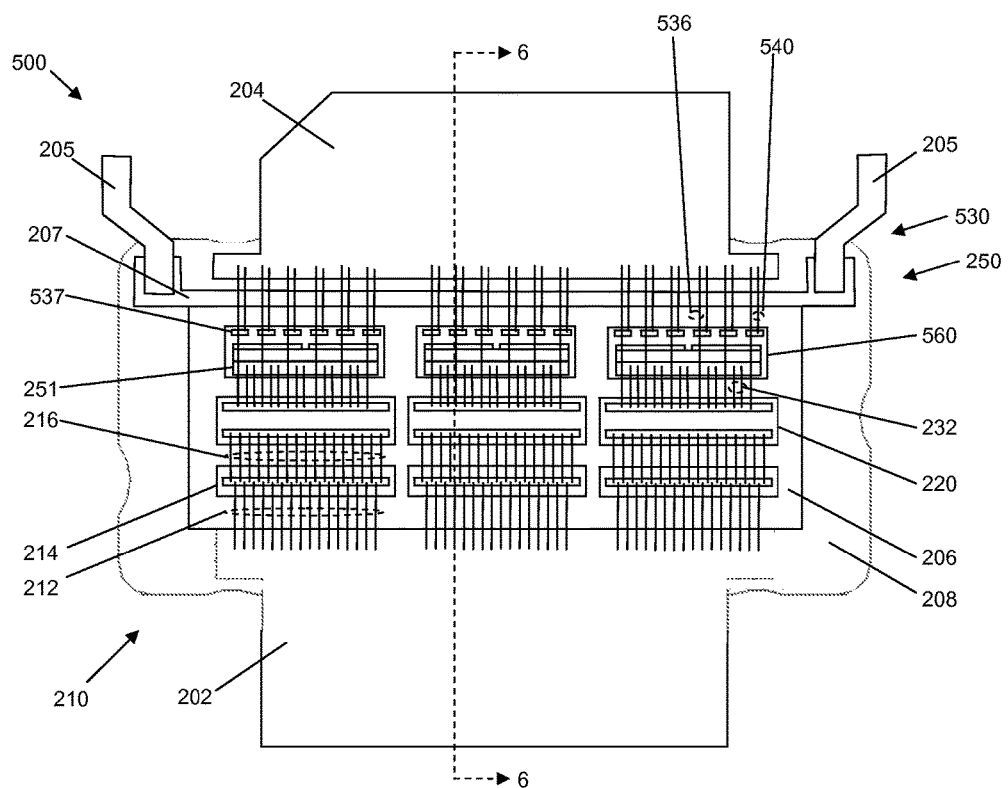
FIG. 5 is a top view of an example of a packaged RF amplifier device that embodies the circuit of FIG. 4, in accordance with an example embodiment.
Figure 6:
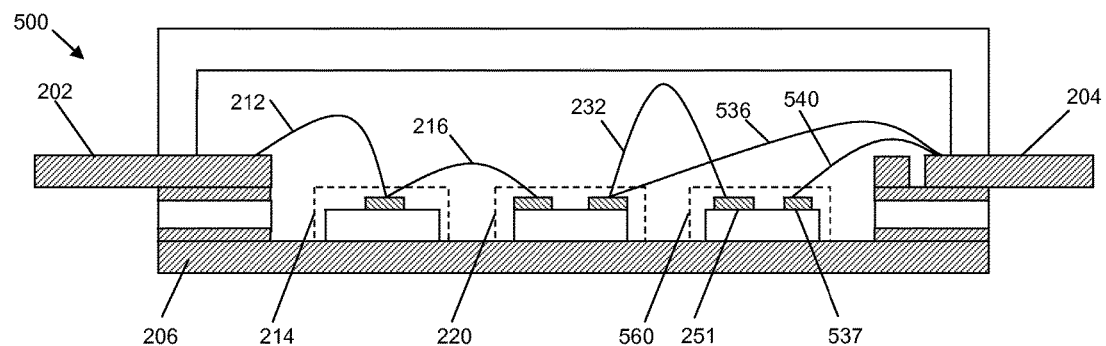
FIG. 6 is a cross-sectional, side view of the RF amplifier device of FIG. 5 along line 6-6.

FIG. 5 is a top view of an example of a packaged RF amplifier device 500 that embodies the circuit of FIG. 4, in accordance with an example embodiment. More particularly, the interconnected electrical components and elements of device 500 may be modeled by the schematic diagram of FIG. 4. For enhanced understanding, FIG. 5 should be viewed in parallel with FIG. 6, which is a cross-sectional, side view of the RF amplifier device 500 of FIG. 5 along line 6-6. Except for the replacement of low-pass matching circuit 135 with low-pass matching circuit 435, and the replacement of inductive element 136 with inductive element 436, packaged RF amplifier device 500 may be substantially similar to the device 200 of FIGS. 2 and 3, and like reference numbers are used in both drawings to indicate elements that may be substantially the same between the two embodiments.

In the device 500 of FIG. 5, each output impedance matching circuit 530 includes three inductive elements 232, 536, 540 (e.g., $L_{shunt}$ 132, $L_{series}$ 436, and $L_{BB}$ 440, FIG. 4) and two capacitors (e.g., $C_{shunt}$ 134 and $C_{BB}$ 438, FIG. 4), where the capacitors form portions of multi-dielectric ceramic device 560 (e.g., multi-dielectric ceramic device 460, FIG. 4), in an embodiment. Again, each inductive element 232, 536, 540 is formed from a plurality of parallel, closely-spaced sets of bondwires. For example, shunt inductive element 232 (e.g., $L_{shunt}$ 132, FIG. 4) includes a plurality of bondwires coupled between the first current conducting terminal (e.g., the drain) of transistor 220 and a first bond pad 251 (e.g., corresponding to RF cold point node 151, FIG. 4) on a top surface of the multi-dielectric ceramic device 560. The first bond pad 251 is electrically coupled to a shunt capacitor (e.g., $C_{shunt}$ 134, FIG. 4) within the multi-dielectric ceramic device 560. A series inductive element 536 (e.g., $L_{series}$ 436, FIG. 4) includes a plurality of bondwires coupled between the first current conducting terminal of transistor 220 and the output lead 204. A bond back inductive element 540 (e.g., $L_{BB}$ 440, FIG. 4) is coupled between the output lead 204 and a second bond pad 237 (e.g., corresponding to node 437, FIG. 4) on the top surface of the multi-dielectric ceramic device 260. The second bond pad 437 is electrically coupled to a bond back capacitor (e.g., $C_{BB}$ 438, FIG. 4) within the multi-dielectric ceramic device 560. Second terminals of the shunt and bond back capacitors within the multi-dielectric ceramic device 560 are coupled to the flange 206 (e.g., to ground).

Figure 7:
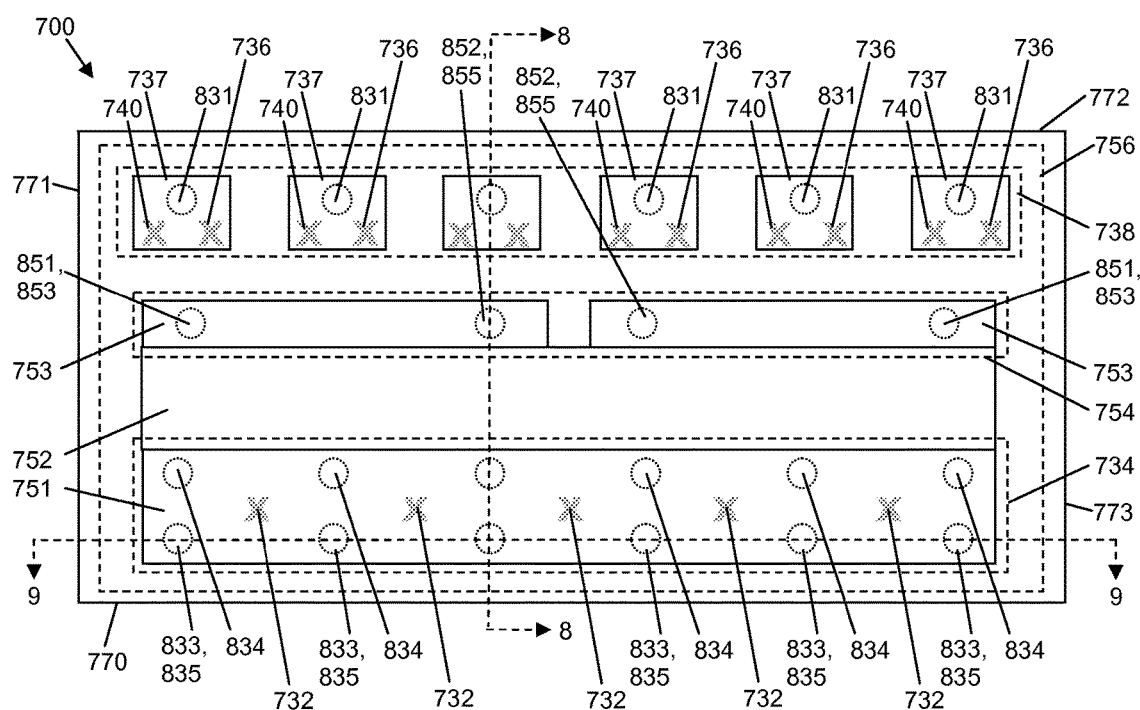
FIG. 7 is a top view of an example of a multi-dielectric ceramic device that includes multiple capacitors of an output circuit, in accordance with an example embodiment.

Embodiments of multi-dielectric ceramic devices that may be included in the output circuits of the above-described RF amplifier devices will now be described in detail. FIG. 7 is a top view of a multi-dielectric ceramic device 700 (e.g., device 160, 260, 460, 560, FIGS. 1-5) suitable for use in an output circuit (e.g., an out impedance matching circuit 130, 230, 430, 530 and envelope frequency termination circuit 150, 250, FIGS. 1-5) in a packaged RF amplifier device (e.g., device 200, 400, FIGS. 2, 4), in accordance with an example embodiment. For enhanced understanding, FIG. 7 should be viewed in conjunction with FIGS. 8 and 9, which illustrate cross-sectional, side views of multi-dielectric ceramic device 700 along lines 8-8 and 9-9, respectively.

Multi-dielectric ceramic device 700 includes several of passive components of an output circuit, such as the components encompassed by box 160, FIG. 1 or by box 460, FIG. 4. The bondwires 732, 736, 740 (FIG. 8) coupled to multi-ceramic device 700 are analogous to the inductive components 132, 136, 140, respectively, and bondwires 232, 236, 240, respectively, of FIGS. 1 and 2. However, those of skill in the art would understand, based on the description herein, that bondwires alternatively could be coupled to multi-ceramic device 700 in a manner that is analogous, instead, to the inductive components 132, 440 and bondwires 232, 540 of FIGS. 4 and 5. Accordingly, multi-ceramic device 700 may be used in either circuit configuration, although the values of some of the components may be altered based on the circuit configuration.

In the illustrated embodiment, multi-dielectric ceramic device 700 includes a first shunt capacitor 734 (e.g., $C_{shunt}$ 134, FIGS. 1, 4), a second shunt capacitor 738 (e.g., $C_{LP}$ 138 or $C_{bb}$ 438, FIGS. 1, 4), an envelope resistor 752 (e.g., $R_{env}$ 152, FIGS. 1, 4), an envelope inductor 754 (e.g., $L_{env}$ 154, FIGS. 1, 4), and an envelope capacitor 756 (e.g., $C_{env}$ 156, FIGS. 1, 4). In FIG. 7, the horizontal areas occupied by the capacitive and inductive components are indicated by dashed boxes 734, 738, 754, 756. More specifically, dashed boxes 734, 738, 756 indicate the approximate area of each electrode plate for capacitors 734, 738, 756, and dashed box 754 indicates the approximate area occupied by each inductor layer of inductor 754. The cross-sectional arrangements of the electrode plates and inductor layers are more evident in FIGS. 8 and 9. The interconnection of each of the passive components will be described in more detail later.

According to an embodiment, multi-dielectric ceramic device 700 has a substantially rectangular footprint, with first, second, third, and fourth sides 770, 771, 772, 773 that extend between first and second opposed surfaces 802, 804 (referred to as top and bottom surfaces herein, respectively). To provide electrical connectivity with the components of the device 700, device 700 includes one or more first contact pads 751 (e.g., corresponding to RF cold point node 151, FIGS. 1, 4) exposed at the top surface 802, and one or more second contact pads 737 (e.g., corresponding to node 137, 437, FIGS. 1, 4) that also are exposed at the top surface 802. A layer of passivation 864 may overlie portions of the top surface 802 other than the contact pads 751, 737. Further, a conductive layer 857 (e.g., corresponding to ground node 157, FIGS. 1, 4) is coupled to the bottom surface 804 of the device 700. Contact pads 751, 737 include bondwire landing sites, indicated with "X"s, which are configured to enable bondwires (e.g., bondwires 732, 736, 740) to be coupled to the contact pads 751, 737.

In addition, device 700 includes a plurality of passive components, as mentioned above, that are electrically coupled between the contact pads 751, 737 and the conductive layer 857. According to an embodiment, the passive components are formed as portions of a plurality of first ceramic layers 810-816, second ceramic layers 860-863, and conductive layers 820-825, 870-873 that are sandwiched between the ceramic layers 810-816, 860-863. In a particular embodiment, the ceramic layers 810-816, 860-863 and conductive layers 820-825, 870-873 are co-fired together using a relatively low temperature process (e.g., device 700 is a low temperature co-fired ceramic (LTCC) device). Accordingly, multi-dielectric ceramic device 700 is a monolithic device, in an embodiment.

The first ceramic layers 810-816 include a first ceramic material that has a first dielectric constant and a first Q factor, and the second ceramic layers 860-863 include a second ceramic material that has a second dielectric constant and a second Q factor that are different from the first dielectric constant and first Q factor. The dielectric constants and Q factors may be voltage and/or frequency and/or temperature dependent. According to an embodiment, the first dielectric material is a relatively lossy material (e.g., low Q factor) with a relatively high dielectric constant (e.g., in a range of about 300-2000, such as about 1000), and the second dielectric material is a low loss material (e.g., high Q factor) with a relatively low dielectric constant (e.g., in a range of about 8 to about 200, such as about 80). For example, the first ceramic layers 810-816 may include relatively low-Q, high dielectric constant material(s), such as barium titanate (BaTiO3), relaxor ferroelectric, other alkaline earth titanates, or other relatively low-Q materials. Conversely, the second ceramic layers 860-863 may include relatively high-Q, low dielectric constant material(s), such as aluminum nitrate (AlN), titanium dioxide, magnesium silicate, or other relatively high-Q materials. In addition to the aforementioned materials, the first and second ceramic layers 810-816, 860-863 may include various additives, which may affect voltage and temperature stability of the materials, and/or may affect other material characteristics.

Conductive layers 820-825, 830, 857, and 870-873 may be formed from any of a variety of metals and/or metal alloys. For example, conductive layers 820-825, 830, 857, and 870-873 may be formed from one or more materials selected from a noble metal, palladium, gold, platinum, silver, nickel, tin-lead, alloys or combinations thereof, and other suitable materials. Desirably, conductive layers 820-825, 830, 857, and 870-873 are formed from a material with a melting point that is higher than firing and/or sintering temperatures that are reached during fabrication of the multi-dielectric ceramic device 700 (e.g., a conductive material that yields a continuous conductive film after sintering or firing, and which does not diffuse into or react with the ceramic dielectric). According to an embodiment, conductive vias 835, 855, 831, 851, 834, 833 electrically couple portions of the conductive layers 820-825, 830, 857, and 870-873, thus providing interconnection of the various components within device 700. The conductive vias 835, 855, 831, 851, 834, 833 may be formed from the same or different materials from the conductive layers 820-825, 830, 857, and 870-873.

Figure 8:
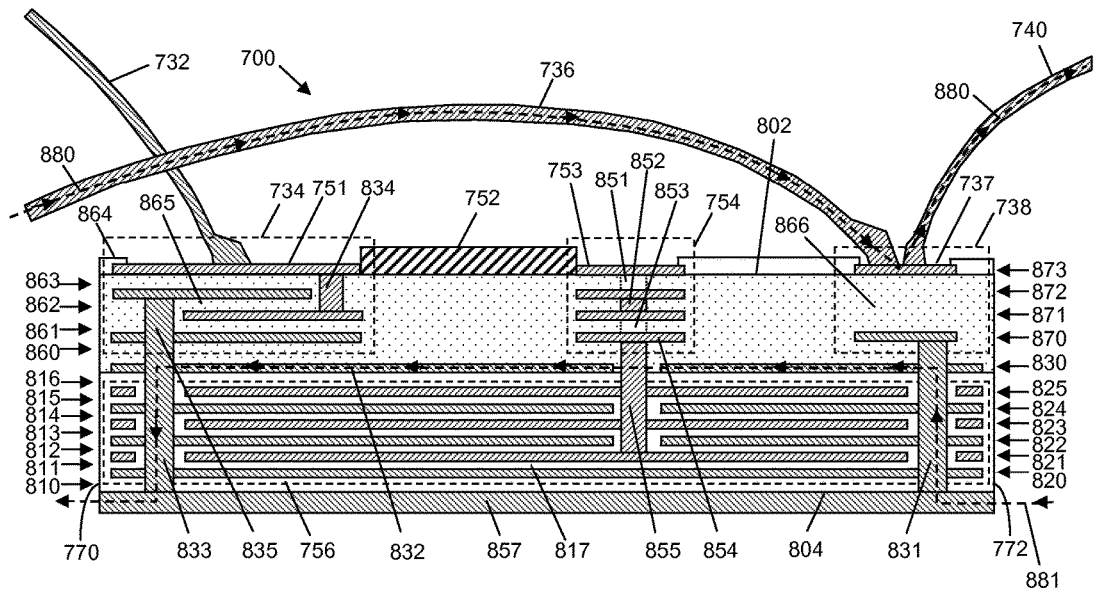
FIG. 8 is a cross-sectional, side view of the multi-dielectric ceramic device of FIG. 7 along line 8-8.
Figure 9:
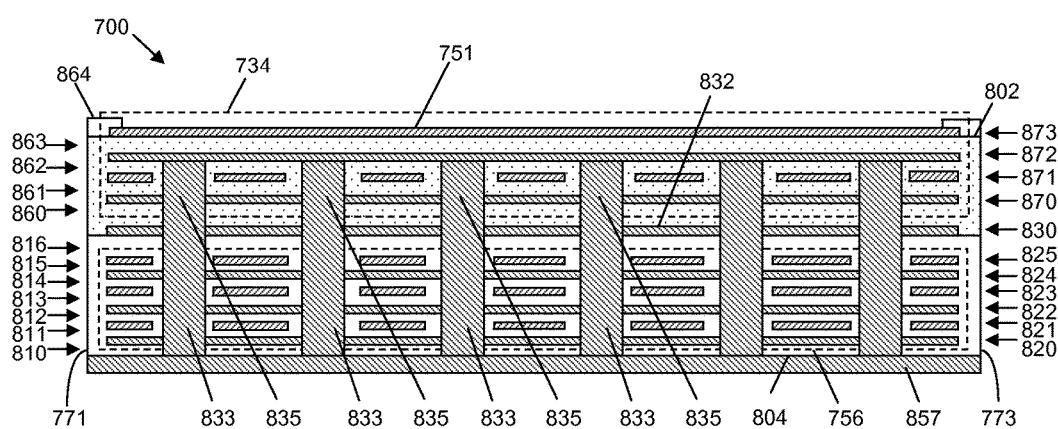
FIG. 9 is a cross-sectional, side view of the multi-dielectric ceramic device of FIG. 7 along line 9-9.

Each passive component will now be discussed in detail, along with a discussion of the interconnections between the passive components. According to an embodiment, the first shunt capacitor 734 (e.g., $C_{shunt}$ 134, FIGS. 1, 4) is a multi-layer capacitor formed from portions of conductive layers 870-873, ceramic layers 861-863, and vias 835, 834. More specifically, portions of conductive layers 871 and 873 that are electrically coupled through vias 834 correspond to plates of a first electrode of capacitor 734, and portions of conductive layers 870 and 872 that are electrically coupled through vias 835 correspond to plates of a second electrode of capacitor 734. The first and second electrode plates are interleaved with each other, with portions of ceramic layers 861-863 (or ceramic material 865) electrically separating the electrode plates of the first electrode from the electrode plates of the second electrode. Conductive layers 871 and 873 (or the first electrode plates of capacitor 734) may be electrically connected to each other through vias 834, and conductive layers 870 and 872 (or the second electrode plates of capacitor 734) may be electrically connected to each other through vias 835, as shown in FIGS. 8 and 9. In other words, the first and second electrode plates alternate in the stack, the set of alternate electrodes that forms the first electrode are coupled with a first termination (e.g., vias 834), and the set of alternate electrodes that forms the second electrode are coupled with a second termination (e.g., vias 835). In an alternate embodiment, rather than using vias 835, 834 as terminations, some or all of conductive layers 870-873 may extend to one of the sides 770, 771, 773 of device 700, and conductive material coupled to (e.g., deposited on) the sides 770, 771, 773 and in contact with the edges of conductive layers 870-873 may provide electrical connectivity between the first and second electrode plates. Accordingly, vias 835, 834 may be more generally referred to as "vertical conductors," which term encompasses embodiments that use conductive structures other than vias.

A portion of the uppermost conductive layer 873 serves as a contact pad 751 (e.g., corresponding to RF cold point node 151, FIGS. 1, 4). This contact pad 751 may have dual functions as both a connection point for bondwires 732 (e.g., inductive element 132 or bondwires 232, FIGS. 1-6) and the uppermost electrode plate of the first electrode of capacitor 734. However, contact pad 751 may be implemented as a distinct element, in an alternate embodiment (i.e., contact pad 751 may not be positioned or configured to function as an electrode plate, in an alternate embodiment). Either way, contact pad 751 is electrically coupled to the first electrode of capacitor 734 (i.e., portions of conductive layers 871, 873 and vias 834). Conversely, the second electrode of capacitor 734 (i.e., portions of conductive layers 870, 872 and vias 835) is electrically coupled to the bottom conductive layer 857 (e.g., to ground node 157, FIGS. 1, 4) through vias 835, 833. Although vias 835 and 833 are shown to be aligned in FIGS. 8 and 9, vias 835 and 833 alternatively may be offset from each other in the vertical direction.

As illustrated, capacitor 734 is a multi-layer capacitor (i.e., a capacitor in which at least one electrode is implemented in the form of a plurality of electrically-coupled electrode plates that are interleaved with electrode plate(s) of the other electrode). In alternate embodiments, capacitor 734 may include more or fewer interleaved electrode plates than are illustrated, or just one electrode plate for each electrode. In any event, capacitor 734 may be described as a ceramic capacitor formed from a stack that includes a first electrode, a second electrode, and a first ceramic material 865 between the first and second electrodes. As discussed previously, the first ceramic material 865 (from which ceramic layers 861-863 are formed) has a first dielectric constant and a first quality factor.

Reference is now made to the second shunt capacitor 738 (e.g., $C_{LP}$ 138 or $C_{bb}$ 438, FIGS. 1, 4). As indicated most clearly in FIG. 7, shunt capacitor 738 is implemented as six capacitors in parallel with each other. In alternate embodiments, shunt capacitor 738 may be implemented using a single capacitor, or using more or fewer than six parallel and/or series coupled capacitors. According to an embodiment, the second shunt capacitor 738 is formed from portions of conductive layers 870 and 873, and ceramic layers 861-863. More specifically, a portion of conductive layer 873 corresponds to a first electrode plate of capacitor 738, and a portion of conductive layer 870 corresponds to a second electrode plate of capacitor 738. Portions of ceramic layers 861-863 (or ceramic material 866) electrically separate the first and second electrode plates.

A portion of the uppermost conductive layer 873 corresponds to contact pad 737 (e.g., corresponding to node 137, 437, FIGS. 1, 4). This contact pad 737 may have dual functions as both a connection point for bondwires 736 and/or 740 (e.g., inductive elements 136, 140, 440 or bondwires 236, 240, 540, FIGS. 1-6) and the first electrode of capacitor 738. However, contact pad 737 may be implemented as a distinct element, in an alternate embodiment (i.e., contact pad 737 may not be positioned or configured to function as an electrode plate, in an alternate embodiment). Either way, contact pad 737 is electrically coupled to the first electrode of capacitor 738 (e.g., a portion of conductive layer 873). Conversely, the second electrode of capacitor 738 (e.g., a portion of conductive layer 870) is electrically coupled to the bottom conductive layer 857 (e.g., to ground node 157, FIGS. 1, 4) through vias 831.

As illustrated, capacitor 738 is a two-layer capacitor (i.e., a capacitor in which each electrode is implemented in the form of a single electrode plate). In alternate embodiments, capacitor 738 may be implemented as a multi-layer capacitor (i.e., including multiple interleaved electrode plates). In any event, capacitor 738 may be described as a ceramic capacitor formed from a stack that includes a first electrode, a second electrode, and ceramic material (e.g., ceramic material 866) between the first and second electrodes. According to an embodiment, ceramic material 866 is the same as ceramic material 865, which separates the electrodes of capacitor 734. In an alternate embodiment, ceramic material 866 may include different materials from ceramic material 865.

Reference is now made to the envelope capacitor 756. According to an embodiment, the envelope capacitor 756 (e.g., $C_{env}$ 156, FIGS. 1, 4) is a multi-layer capacitor formed from portions of conductive layers 820-825, ceramic layers 811-815, and vias 855, 831, 833. More specifically, portions of conductive layers 821, 823, 825 that are electrically coupled through vias 855 correspond to plates of a first electrode of capacitor 756, and portions of conductive layers 820, 822, 824 that are electrically coupled through vias 831, 833 correspond to plates of a second electrode of capacitor 756. The first and second electrode plates are interleaved with each other, with portions of ceramic layers 811-815 (or ceramic material 817) electrically separating the electrode plates of the first electrode from the electrode plates of the second electrode. Conductive layers 821, 823, 825 (or the first electrode plates of capacitor 756) may be electrically connected to each other through vias 855, and conductive layers 820, 822, 824 (or the second electrode plates of capacitor 756) may be electrically connected to each other through vias 831, 833, as shown in FIGS. 8 and 9. In an alternate embodiment, rather than using vias 855, 831, 833, some or all of conductive layers 820-825 may extend to one of the sides 770-774 of device 700, and conductive material coupled to (e.g., deposited on) the sides 770-774 and in contact with the edges of conductive layers 820-825 may provide electrical connectivity between the first and second electrode plates. Accordingly, vias 855, 831, 833 may be more generally referred to as "vertical conductors," which term encompasses embodiments that use conductive structures other than vias.

As will be described in more detail later, the first electrode of capacitor 756 (i.e., portions of conductive layers 821, 823, 825) are electrically coupled to the contact pad 751 through the series combination of envelope resistor 752, envelope inductor 754 and vias 855. Conversely, the second electrode of capacitor 756 (i.e., portions of conductive layers 820, 822, 824) is electrically coupled to the bottom conductive layer 857 (e.g., to ground node 157, FIGS. 1, 4) through vias 831 and 833.

As illustrated, capacitor 756 is a multi-layer capacitor. In alternate embodiments, capacitor 756 may include more or fewer interleaved electrode plates than are illustrated, or just one electrode plate for each electrode. In any event, capacitor 756 may be described as a ceramic capacitor formed from a stack that includes a first electrode, a second electrode, and a second ceramic material 817 between the first and second electrodes. As discussed previously, the second ceramic material 817 (from which ceramic layers 811-815 are formed) has a second dielectric constant and a second quality factor that are different from the first dielectric constant and the first quality factor of the first ceramic material 865, 866 included in capacitors 734, 738. According to an embodiment, ceramic material 817 has a significantly lower Q (and possibly a higher dielectric constant) than ceramic material 865, 866.

As discussed previously, an embodiment of a baseband termination circuit (e.g., baseband termination circuit 150, FIGS. 1, 4) includes a series combination of an envelope resistor 752 (e.g., $R_{env}$ 152, FIGS. 1, 4), an envelope inductor 754 (e.g., $L_{env}$ 154, FIGS. 1, 4), and envelope capacitor 756 (e.g., $C_{env}$ 156, FIGS. 1, 4). In the embodiment of FIGS. 7-9, envelope resistor 752 is coupled to the top surface 802 of device 700, and is electrically coupled between contact pad 751 (e.g., RF cold point node 151, FIGS. 1, 4) and a first terminal 753 of the envelope inductor 754 (e.g., node 153, FIGS. 1, 4). According to an embodiment, envelope resistor 752 is a thick- or thin-film resistor that is formed on the surface 802 of the device 700. In an alternate embodiment, envelope resistor 752 may be a discrete component mounted to surface 802.

As indicated most clearly in FIG. 7, envelope inductor 754 (e.g., $L_{env}$ 154, FIGS. 1, 4) is implemented as two inductors in parallel with each other. In alternate embodiments, the envelope inductor 754 may be implemented using a single inductor, or using more than two parallel and/or series coupled inductors. According to an embodiment, the envelope inductor 754 includes one or more multi-layer inductors, each formed from portions of conductive layers 870-873, ceramic layers 861-863, and vias 851, 852, 853. More specifically, conductive layers 870-873 are electrically coupled through vias 851-853 in a manner that results in an undulating or zig-zag path between the first terminal 753 of the envelope inductor 754 (e.g., node 153, FIGS. 1, 4) and the second terminal 854 of the envelope inductor 754. Said another way, envelope inductor 754 is formed from a plurality of serially-coupled inductor segments formed from multiple conductive layers 870-873 that are separated from each other by the ceramic material of ceramic layers 861-863. The second terminal 854 of the envelope inductor 754 is electrically coupled to the first electrode of envelope capacitor 756 through vias 855. In an alternate embodiment, rather than using vias 851-853, 855, some or all of conductive layers 870-873 may extend to one of the sides 770-774 of device 700, and conductive material coupled to (e.g., deposited on) the sides 770-774 and in contact with the edges of conductive layers 870-873 may provide electrical connectivity between the portions of layers 870-873 that form the envelope inductor 754.

In the illustrated embodiment, envelope inductor 754 is a multi-layer inductor. In alternate embodiments, envelope inductor 754 may be a discrete component mounted to surface 802, or may be formed from a plurality of bondwires that are interconnected in series with envelope resistor 752 between contact pad 751 (e.g., the RF cold point node 151, FIGS. 1, 4) and envelope capacitor 756. Further, although FIGS. 1, 4, and 6-8 depict the baseband termination circuit as including a series combination of envelope resistor 152, 752, envelope inductor 154, 754, and envelope capacitor 156, 756, in that order, the envelope resistor 152, 752, envelope inductor 154, 754, and envelope capacitor 156, 756 could be series coupled in different orders, in alternate embodiments. In addition, although FIGS. 1 and 4 depict envelope resistor 152, envelope inductor 154, and envelope capacitor 156 as being singular lumped components, any of envelope resistor 152, envelope inductor 154, and envelope capacitor 156 could be implemented as multiple components.

As is most clearly understood with reference to FIG. 8, forward current (indicated by dashed line 880) is carried through bondwires 736 and 740 over device 700. Reverse current (indicated by dashed line 881), in contrast, is carried through a reverse current path structure that also is included as a part of device 700. More specifically, the main reverse current path structure includes a first vertical conductor (e.g., in the form of vias 831), a lateral conductor 832, and a second vertical conductor (e.g., in the form of vias 833). According to an embodiment, the first vertical conductor is located proximate to a side 772 of device 700 that the reverse current 881 would impinge upon first during operation (e.g., the side 772 of device 700 closest to the output lead(s) 204, FIGS. 2, 3, 5, 6). Conversely, the second vertical conductor is located proximate to an opposite side 770 of device 700 (e.g., the side 770 of device 700 closest to the transistors 220, FIGS. 2, 3, 5, 6). The term "proximate to," in reference to the positions of the first and second vertical conductors with respect to sides 770, 772 means at, on, or below sides 770, 772. "Below," in reference to the previous sentence, means a distance from the sides 770, 772 that does not exceed 20 percent of the total distance between sides 770, 772, in an embodiment. In a further embodiment, "below" means a distance from the sides 770, 772 that does not exceed 10 percent of the total distance between sides 770, 772.

The first vertical conductor extends across ceramic layers 810-816 from a first side of the lateral conductor 832 (i.e., the side of lateral conductor 832 proximate to side 772 of device 700) to surface 804 of device 700, and the first vertical conductor is electrically coupled to conductive layer 857. As used herein, the term "extends across" may mean "extends through" or "extends over a surface of," in various embodiments. In the illustrated embodiment, the first vertical conductor includes vias 831, which also function to electrically couple terminals of capacitors 738 and 756 to conductive layer 857. Accordingly, vias 831 and conductive layer 857 serve as a common node (e.g., a ground node 157, FIGS. 1, 4) for capacitors 738, 756 and lateral conductor 832. In an alternate embodiment, the first vertical conductor may include one or more conductive structures that are not coupled to capacitors 738, 756, but which nonetheless extend from the first side of the lateral conductor 832 to surface 804 and conductive layer 857. For example, the first vertical conductor may include one or more dedicated vias other than the vias 831 that are electrically coupled to capacitors 738, 756. Alternatively, the lateral conductor 832 may extend to side 772 of the device 700, and the first vertical conductor may include conductive material that is coupled to (e.g., deposited on) side 772 in contact with the lateral conductor 832, and which extends to surface 804 and conductive layer 857. Although FIG. 7 depicts six vias 831 corresponding to the first vertical conductor, other embodiments may include more or fewer vias.

The second vertical conductor extends across ceramic layers 810-816 from a second side of the lateral conductor 832 (i.e., the side of lateral conductor 832 proximate to side 770 of device 700) to surface 804 of device 700, and the second vertical conductor is electrically coupled to conductive layer 857. In the illustrated embodiment, the second vertical conductor includes vias 833, which also function to electrically couple terminals of capacitors 734 and 756 to conductive layer 857. Accordingly, vias 833 and conductive layer 857 also serve as a common node (e.g., a ground node 157, FIGS. 1, 4) for capacitors 734, 756 and lateral conductor 832. In an alternate embodiment, the second vertical conductor may include one or more conductive structures that are not coupled to capacitors 734, 756, but which nonetheless extend from the second side of the lateral conductor 832 to surface 804 and conductive layer 857. For example, the second vertical conductor may include one or more dedicated vias other than the vias 833 that are electrically coupled to capacitors 734, 756. Alternatively, the lateral conductor 832 may extend to side 770 of the device 700, and the second vertical conductor may include conductive material that is coupled to (e.g., deposited on) side 770 in contact with the lateral conductor 832, and which extends to surface 804 and conductive layer 857. Although FIG. 7 depicts six vias 833 corresponding to the second vertical conductor, other embodiments may include more or fewer vias.

The lateral conductor 832 includes a portion of conductive layer 830, which extends between and is electrically coupled to the first and second vertical conductors (e.g., vias 831 and 833). Essentially, the lateral conductor 832 is parallel with the electrodes of capacitors 734, 738, and 756, and extends in an orthogonal direction from the first and second vertical conductors. According to an embodiment, the lateral conductor 832 is located between the ceramic materials 817, 865 that separate the electrodes of capacitors 756 and 734. Accordingly, the lateral conductor 832 may be considered to be located between capacitors 734 (and/or 738) and 756.

According to an embodiment, the horizontal area occupied by the lateral conductor 832 is approximately the same as the horizontal area occupied by the electrodes of envelope capacitor 756 (e.g., the area indicated by dashed box 756, FIG. 7). For example, the lateral conductor 832 may be a continuous portion of conductive layer 830 (e.g., a sheet) across substantially the entire area of the electrodes of envelope capacitor 756, except for voids that enable vias 855 to extend between envelope inductor 754 and envelope capacitor 756 without being shorted to the lateral conductor 832 and the ground node (e.g., conductive layer 857). In an alternate embodiment, the lateral conductor 832 may include a plurality of conductors that extend between and electrically couple vias 831 and 833.

As FIG. 8 shows and the above description indicates, the reverse current path structure (including the first and second vertical conductors (e.g., vias 831, 833) and lateral conductor 832) provides a continuous conductive path between surface 804 toward side 772 of device 700, up and across the span of the lateral conductor 832, and down to surface 804 toward side 770 of device 700. In other words, the reverse current path structure circumscribes most of the relatively low-Q ceramic material 817 included in $C_{env}$ 756 (i.e., portions of ceramic layers 811-815). Described yet another way, in the embodiment of FIGS. 8 and 9, the reverse current path structure is physically positioned between $C_{env}$ 756 and the forward current path 880 (or between $C_{env}$ 756 and $C_{shunt}$ 734).

During operation, significant portions of the reverse current 881 may travel through the reverse current path structure, rather than traveling along the surface of the substrate to which device 700 is attached (e.g., flange 206, FIG. 2). Although eddy currents still may develop between the reverse current path 881 and the forward current path 880, those eddy currents would not significantly impinge upon the relatively lossy ceramic material 817, and thus those eddy currents would not induce significant losses through the ceramic material 817. In other words, the reverse current path structure substantially eliminates the presence of relatively lossy high dielectric material (e.g., ceramic material 817) between the device's forward path 880 and the portion of the return current path 881 that is carried by the reverse current path structure.

The embodiment described in conjunction with FIGS. 7-9, include a reverse current path through which reverse current 881 may travel, where the reverse current path structure is configured to bypass most or all of the relatively lossy ceramic material 817 of $C_{env}$ 756. In another embodiment, a multi-dielectric ceramic device includes a forward current path structure that is configured to carry forward current. Similar to the previously described embodiment, the forward current path structure is physically positioned between $C_{env}$ and the reverse current path, and the forward current path structure is configured to bypass most or all of the relatively lossy ceramic material of $C_{env}$. Such an embodiment is described in more detail below in conjunction with FIGS. 10 and 11.

Figure 10:
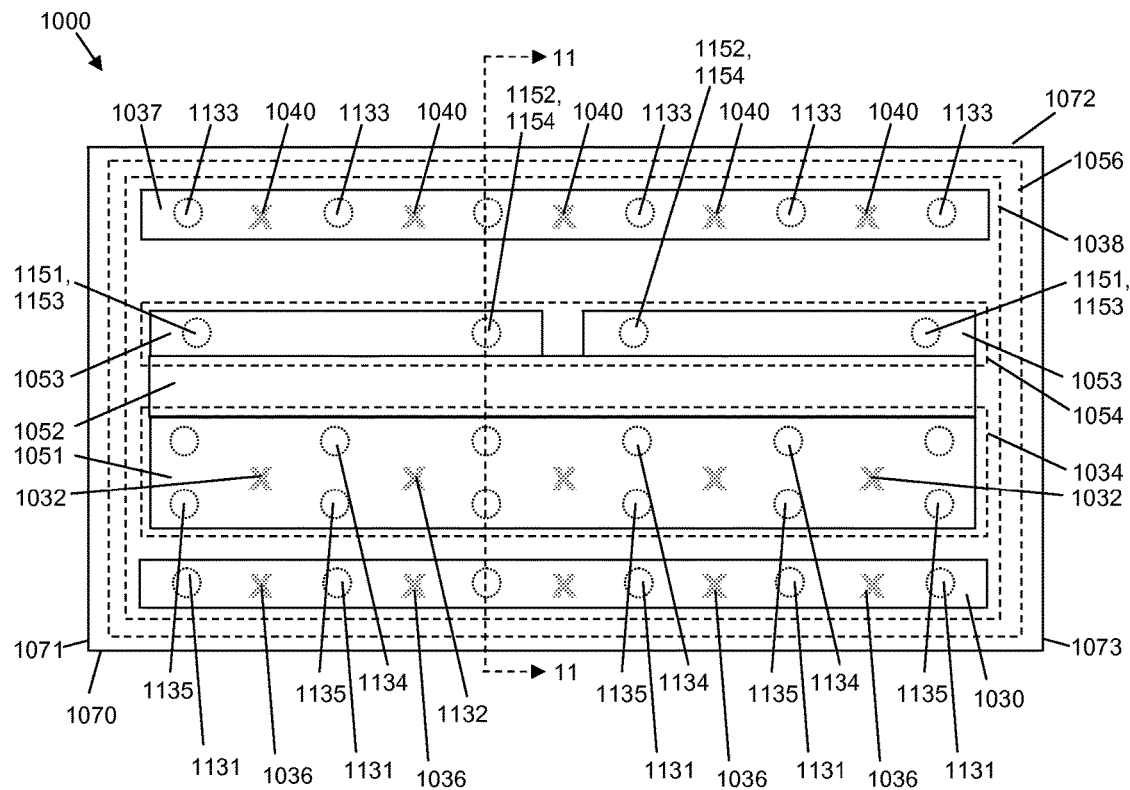
FIG. 10 is a top view of an example of a multi-dielectric ceramic device that includes multiple capacitors of an output circuit, in accordance with another example embodiment.

FIG. 10 is a top view of a multi-dielectric ceramic device 1000 (e.g., device 160, 260, 460, 560, FIGS. 1-5) suitable for use in an output circuit (e.g., an out impedance matching circuit 130, 230, 430, 530 and envelope frequency termination circuit 150, 250, FIGS. 1-5) in a packaged RF amplifier device (e.g., device 200, 400, FIGS. 2, 4), in accordance with another example embodiment. For enhanced understanding, FIG. 10 should be viewed in conjunction with FIG. 11, which illustrates a cross-sectional, side view of multi-dielectric ceramic device 1000 along line 11-11.

Multi-dielectric ceramic device 1000 includes several of passive components of an output circuit, such as the components encompassed by box 160, FIG. 1 or by box 460, FIG. 4. The bondwires 1032, 1036, 1040 (FIG. 11) coupled to multi-ceramic device 1000 are analogous to the inductive components 132, 136, 140, respectively, and bondwires 232, 236, 240, respectively, of FIGS. 1 and 2. However, those of skill in the art would understand, based on the description herein, that bondwires alternatively could be coupled to multi-ceramic device 1000 in a manner that is analogous, instead, to the inductive components 132, 440 and bondwires 232, 540 of FIGS. 4 and 5. Accordingly, multi-ceramic device 1000 may be used in either circuit configuration, although the values of some of the components may be altered based on the circuit configuration.

In the illustrated embodiment, multi-dielectric ceramic device 1000 includes a first shunt capacitor 1034 (e.g., $C_{shunt}$ 134, FIGS. 1, 4), a second shunt capacitor 1038 (e.g., $C_{LP}$ 138 or $C_{bb}$ 438, FIGS. 1, 4), an envelope resistor 1052 (e.g., $R_{env}$ 152, FIGS. 1, 4), an envelope inductor 1054 (e.g., $L_{env}$ 154, FIGS. 1, 4), and an envelope capacitor 1056 (e.g., $C_{env}$ 156, FIGS. 1, 4). In FIG. 10, the horizontal areas occupied by the capacitive and inductive components are indicated by dashed boxes 1034, 1038, 1054, 1056. More specifically, dashed boxes 1034, 1038, 1056 indicate the approximate area of each electrode plate for capacitors 1034, 1038, 1056, and dashed box 1054 indicates the approximate area occupied by each inductor layer of inductor 1054. The cross-sectional arrangements of the electrode plates and inductor layers are more evident in FIG. 11. The interconnection of each of the passive components will be described in more detail later.

According to an embodiment, multi-dielectric ceramic device 1000 has a substantially rectangular footprint, with first, second, third, and fourth sides 1070, 1071, 1072, 1073 that extend between first and second opposed surfaces 1102, 1104 (referred to as top and bottom surfaces herein, respectively). To provide electrical connectivity with the components of the device 1000, device 1000 includes one or more first contact pads 1051 (e.g., corresponding to RF cold point node 151, FIGS. 1, 4), one or more second contact pads 1037 (e.g., corresponding to node 137, 437, FIGS. 1, 4), and one or more third contact pads 1030, each of which is exposed at the top surface 1102. A layer of passivation 1164 may overlie portions of the top surface 1102 other than the contact pads 1051, 1037, 1030. Further, a conductive layer 1157 (e.g., corresponding to ground node 157, FIGS. 1, 4) is coupled to the bottom surface 1104 of the device 1000. Contact pads 1051, 1037, 1030 include bondwire landing sites, indicated with "X"s, which are configured to enable bondwires (e.g., bondwires 1032, 1040, 1036, respectively) to be coupled to the contact pads 1051, 1037, 1030.

In addition, device 1000 includes a plurality of passive components, as mentioned above, that are electrically coupled between the contact pads 1051, 1037 and the conductive layer 1157. According to an embodiment, the passive components are formed as portions of a plurality of first ceramic layers 1110-1116, second ceramic layers 1160-1163, third ceramic layer(s) 1138, and conductive layers 1120-1125, 1130, 1170-1173 that are sandwiched between the ceramic layers 1110-1116, 1160-1163, 1138. In a particular embodiment, the ceramic layers 1110-1116, 1160-1163, 1138 and conductive layers 1120-1125, 1130, 1170-1173 are co-fired together using a relatively low temperature process (e.g., device 1000 is a monolithic LTCC device).

The first ceramic layers 1110-1116 include a first ceramic material that has a first dielectric constant and a first Q factor, the second ceramic layers 1160-1163 include a second ceramic material that has a second dielectric constant and a second Q factor that are different from the first dielectric constant and first Q factor, and the third ceramic layers 1138 include a third ceramic material that has a third dielectric constant and a third Q factor. According to an embodiment, the second and third ceramic layers 1160-1163, 1138 include the same ceramic material (i.e., the second and third ceramic materials are the same), although they may include different ceramic materials, as well. The dielectric constants and Q factors may be voltage and/or frequency and/or temperature dependent. According to an embodiment, the first dielectric material is a relatively lossy material (e.g., low Q factor) with a relatively high dielectric constant (e.g., in a range of about 300-2000, such as about 1000), and the second and third dielectric materials are low loss materials (e.g., high Q factor) with relatively low dielectric constants (e.g., in a range of about 10 to about 200, such as about 110). For example, the first ceramic layers 1110-1116 may include relatively low-Q, high dielectric constant material(s), such as barium titanate (BaTiO3), relaxor ferroelectric, other alkaline earth titanates, or other relatively low-Q materials. Conversely, the second and third ceramic layers 1160-1163, 1138 may include relatively high-Q, low dielectric constant material(s), such as AlN, titanium dioxide, magnesium silicate, or other relatively high-Q materials. In addition to the aforementioned materials, the first, second, and third ceramic layers 1110-1116, 1160-1163, 1138 may include various additives, which may affect voltage and temperature stability of the materials, and/or may affect other material characteristics.

Conductive layers 1120-1125, 1130, 1157, and 1170-1173 may be formed from any of a variety of metals and/or metal alloys. For example, conductive layers 1120-1125, 1130, 1157, and 1170-1173 may be formed from one or more materials selected from a noble metal, palladium, gold, platinum, silver, nickel, tin-lead, alloys or combinations thereof, and other suitable materials. According to an embodiment, conductive vias 1131, 1133-1135, and 1151-1155 electrically couple portions of the conductive layers 1120-1125, 1130, 1157, and 1170-1173, thus providing interconnection of the various components within device 1000.

Each passive component will now be discussed in detail, along with a discussion of the interconnections between the passive components. According to an embodiment, the first shunt capacitor 1034 (e.g., $C_{shunt}$ 134, FIGS. 1, 4) is a multi-layer capacitor formed from portions of conductive layers 1170-1173, ceramic layers 1161-1163, and vias 1134, 1135. More specifically, portions of conductive layers 1171 and 1173 that are electrically coupled through vias 1134 correspond to plates of a first electrode of capacitor 1034, and portions of conductive layers 1170 and 1172 that are electrically coupled through vias 1135 correspond to plates of a second electrode of capacitor 1034. The first and second electrode plates are interleaved with each other, with portions of ceramic layers 1161-1163 (or ceramic material 1165) electrically separating the electrode plates of the first electrode from the electrode plates of the second electrode. Conductive layers 1171 and 1173 (or the first electrode plates of capacitor 1034) may be electrically connected to each other through vias 1134, and conductive layers 1170 and 1172 (or the second electrode plates of capacitor 1034) may be electrically connected to each other through vias 1135, as shown in FIG. 11. In an alternate embodiment, rather than using vias 1134, 1135, some or all of conductive layers 1170-1173 may extend to one of the sides 1070, 1071, 1073 of device 1000, and conductive material coupled to (e.g., deposited on) the sides 1070, 1071, 1073 and in contact with the edges of conductive layers 1170-1173 may provide electrical connectivity between the first and second electrode plates. Accordingly, vias 1134, 1135.

A portion of the uppermost conductive layer 1173 serves as a contact pad 1051 (e.g., corresponding to RF cold point node 151, FIGS. 1, 4). This contact pad 1051 may have dual functions as both a connection point for bondwires 1032 (e.g., inductive element 132 or bondwires 232, FIGS. 1-6) and the uppermost electrode plate of the first electrode of capacitor 1034. However, contact pad 1051 may be implemented as a distinct element, in an alternate embodiment (i.e., contact pad 1051 may not be positioned or configured to function as an electrode plate, in an alternate embodiment). Either way, contact pad 1051 is electrically coupled to the first electrode of capacitor 1034 (i.e., portions of conductive layers 1171, 1173 and vias 1134). Conversely, the second electrode of capacitor 1034 (i.e., portions of conductive layers 1170, 1172 and vias 1135) is electrically coupled to the bottom conductive layer 1157 (e.g., to ground node 157, FIGS. 1, 4) through vias 1135.

As illustrated, capacitor 1034 is a multi-layer capacitor. In alternate embodiments, capacitor 1034 may include more interleaved electrode plates than is illustrated, or just one electrode plate for each electrode. In any event, capacitor 1034 may be described as a ceramic capacitor formed from a stack that includes a first electrode, a second electrode, and a first ceramic material 1165 between the first and second electrodes. As discussed previously, the first ceramic material 1165 (from which ceramic layers 1161-1163 are formed) has a first dielectric constant and a first quality factor.

Reference is now made to the second shunt capacitor 1038 (e.g., $C_{LP}$ 138 or $C_{bb}$ 438, FIGS. 1, 4). As indicated most clearly in FIG. 10, shunt capacitor 1038 is implemented as a single capacitor. In alternate embodiments, shunt capacitor 1038 may be implemented using multiple parallel and/or series coupled capacitors. According to an embodiment, the second shunt capacitor 1038 is formed from portions of conductive layers 1130 and 1157, and ceramic layers 1138. More specifically, a portion of conductive layer 1130 corresponds to a first electrode plate of capacitor 1038, and a portion of conductive layer 1157 corresponds to a second electrode plate of capacitor 1038. Portions of ceramic layers 1138 (or ceramic material 1166) electrically separate the first and second electrode plates. Although the first and second electrode plates of capacitor 1038 may be relatively large, as illustrated in FIGS. 10 and 11, the first and second electrode plates could be designed to be smaller, as well, in order to design in a desired capacitive value for capacitor 1038. In addition, the thickness of layers 1138 also could be adjusted to achieve a desired capacitive value.

As will be described in more detail later, layer 1130 also provides a portion of a forward current path structure. Therefore, layer 1130 has a dual purpose (e.g., as the top plate of capacitor 1038 and as the portion of the forward current path structure). In an alternate embodiment, the top plate of capacitor 1038 may be implemented using a different layer from layer 1130. Similarly, the bottom plate of capacitor 1138 may be implemented using a different layer from layer 1157 (e.g., a conductive layer that is separated from layer 1157 by one or more ceramic layers, and electrically connected to layer 1157 through one of more conductive vias or other conductive structures).

The first electrode of capacitor 1038 (e.g., the portion of layer 1130 that corresponds to the top plate of capacitor 1038) is electrically coupled to contact pads 1030, 1037 through conductive vias 1131, 1133, respectively. According to an embodiment, contact pads 1030, 1037 are formed from portions of the uppermost conductive layer 1173. The second electrode of capacitor 1038 (e.g., a portion of conductive layer 1157) is electrically coupled to the bottom conductive layer 1157 (e.g., to ground node 157, FIGS. 1, 4).

As illustrated, capacitor 1038 is a two-layer capacitor (i.e., a capacitor in which each electrode is implemented in the form of a single electrode plate). In alternate embodiments, capacitor 1038 may be implemented as a multi-layer capacitor (i.e., including multiple interleaved electrode plates). In any event, capacitor 1038 may be described as a ceramic capacitor formed from a stack that includes a first electrode, a second electrode, and ceramic material (e.g., ceramic material 1166) between the first and second electrodes. According to an embodiment, ceramic material 1166 is the same as ceramic material 1165, which separates the electrodes of capacitor 1034. In an alternate embodiment, ceramic material 1166 may include different materials from ceramic material 1165.

According to an embodiment, the elements of second shunt capacitor 1038 may be configured to function more as a conductor-backed, low impedance transmission line, rather than strictly a capacitive element. For example, conductive layer 1130 (or the first electrode of capacitor 1038) may be configured to convey the forward signal of the transmission line, and conductive layer 1157 may be configured to function as the ground electrode plate of the transmission line.

Reference is now made to the envelope capacitor 1056. According to an embodiment, the envelope capacitor 1056 (e.g., $C_{env}$ 156, FIGS. 1, 4) is a multi-layer capacitor formed from portions of conductive layers 1120-1125, ceramic layers 1111-1115, and vias 1135, 1155. More specifically, portions of conductive layers 1121, 1123, 1125 that are electrically coupled through vias 1155 correspond to plates of a first electrode of capacitor 1056, and portions of conductive layers 1120, 1122, 1124 that are electrically coupled through vias 1135 correspond to plates of a second electrode of capacitor 1056. The first and second electrode plates are interleaved with each other, with portions of ceramic layers 1111-1115 (or ceramic material 1117) electrically separating the electrode plates of the first electrode from the electrode plates of the second electrode. Conductive layers 1121, 1123, 1125 (or the first electrode plates of capacitor 1056) may be electrically connected to each other through vias 1155, and conductive layers 1120, 1122, 1124 (or the second electrode plates of capacitor 1056) may be electrically connected to each other through vias 1135, as shown in FIG. 11. In an alternate embodiment, rather than using vias 1135, 1155, some or all of conductive layers 1120-1125 may extend to one of the sides 1070-1074 of device 1000, and conductive material coupled to (e.g., deposited on) the sides 1070-1074 and in contact with the edges of conductive layers 1120-1125 may provide electrical connectivity between the first and second electrode plates. Accordingly, vias 1135, 1155 may be more generally referred to as "vertical conductors."

As will be described in more detail later, the first electrode of capacitor 1056 (i.e., portions of conductive layers 1121, 1123, 1125) are electrically coupled to the contact pad 1051 through the series combination of envelope resistor 1052, envelope inductor 1054 and vias 1155. Conversely, the second electrode of capacitor 1056 (i.e., portions of conductive layers 1120, 1122, 1124) is electrically coupled to the bottom conductive layer 1157 (e.g., to ground node 157, FIGS. 1, 4) through vias 1135.

As illustrated, capacitor 1056 is a multi-layer capacitor. In alternate embodiments, capacitor 1056 may include more or fewer interleaved electrode plates than are illustrated, or just one electrode plate for each electrode. In any event, capacitor 1056 may be described as a ceramic capacitor formed from a stack that includes a first electrode, a second electrode, and a second ceramic material 1117 between the first and second electrodes. As discussed previously, the second ceramic material 1117 (from which ceramic layers 1111-1115 are formed) has a second dielectric constant and a second quality factor that are different from the dielectric constant(s) and the quality factor(s) of the ceramic material(s) 1165, 1166 included in capacitors 1034, 1038. According to an embodiment, ceramic material 1117 has a significantly lower Q (and higher dielectric constant) than ceramic material(s) 1165, 1166.

As discussed previously, an embodiment of a baseband termination circuit (e.g., baseband termination circuit 150, FIGS. 1, 4) includes a series combination of an envelope resistor 1052 (e.g., $R_{env}$ 152, FIGS. 1, 4), an envelope inductor 1054 (e.g., $L_{env}$ 154, FIGS. 1, 4), and envelope capacitor 1056 (e.g., $C_{env}$ 156, FIGS. 1, 4). In the embodiment of FIG. 10, envelope resistor 1052 is coupled to the top surface 1102 of device 1000, and is electrically coupled between contact pad 1051 (e.g., RF cold point node 151, FIGS. 1, 4) and a first terminal 1053 of the envelope inductor 1054 (e.g., node 153, FIGS. 1, 4). According to an embodiment, envelope resistor 1052 is a thick- or thin-film resistor that is formed on the surface 1102 of the device 1000. In an alternate embodiment, envelope resistor 1052 may be a discrete component mounted to surface 1102.

As indicated most clearly in FIG. 10, envelope inductor 1054 (e.g., $L_{env}$ 154, FIGS. 1, 4) is implemented as two inductors in parallel with each other. In alternate embodiments, the envelope inductor 1054 may be implemented using a single inductor, or using more than two parallel and/or series coupled inductors. According to an embodiment, the envelope inductor 1054 includes one or more multi-layer inductors, each formed from portions of conductive layers 1170-1173, ceramic layers 1161-1163, and vias 1151, 1152, 1153. More specifically, conductive layers 1170-1173 are electrically coupled through vias 1151-1153 in a manner that results in an undulating or zig-zag path between the first terminal 1053 of the envelope inductor 1054 (e.g., node 153, FIGS. 1, 4) and the second terminal 1154 of the envelope inductor 1054. The second terminal 1154 of the envelope inductor 1054 is electrically coupled to the first electrode of envelope capacitor 1056 through vias 1155. In an alternate embodiment, rather than using vias 1151-1153, 1155, some or all of conductive layers 1170-1173 may extend to one of the sides 1070-1074 of device 1000, and conductive material coupled to (e.g., deposited on) the sides 1070-1074 and in contact with the edges of conductive layers 1170-1173 may provide electrical connectivity between the portions of layers 1170-1173 that form the envelope inductor 1054.

In the illustrated embodiment, envelope inductor 1054 is a multi-layer inductor. In alternate embodiments, envelope inductor 1054 may be a discrete component mounted to surface 1102, or may be formed from a plurality of bondwires that are interconnected in series with envelope resistor 1052 between contact pad 1051 (e.g., the RF cold point node 151, FIGS. 1, 4) and envelope capacitor 1056. Further, although FIGS. 10 and 11 depict the baseband termination circuit as including a series combination of envelope resistor 1052, envelope inductor 1054, and envelope capacitor 1056, in that order, the envelope resistor 1052, envelope inductor 1054, and envelope capacitor 1056 could be series coupled in different orders, in alternate embodiments.

As is most clearly understood with reference to FIG. 11, during operation, reverse current (indicated by dashed line 1181) is conveyed laterally through conductive layer 1157 from side 1072 to side 1070 of device.

Forward current (indicated by dashed line 1180), in contrast, is carried through a forward current path structure that also is included as a part of device 1000. More specifically, the forward current path structure includes a first vertical conductor (e.g., in the form of vias 1131), a lateral conductor 1132, and a second vertical conductor (e.g., in the form of vias 1133). According to an embodiment, the first vertical conductor is located proximate to a side 1070 of device 1000 closest to the transistors (e.g., transistors 220, FIGS. 2, 3, 5, 6). Conversely, the second vertical conductor is located proximate to an opposite side 1072 of device 1000 (e.g., the side 1072 of device 1000 closest to the output lead(s) 204, FIGS. 2, 3, 5, 6).

The first vertical conductor extends across ceramic layers 1110-1116 and 1160-1163 from a first side of the lateral conductor 1132 (i.e., the side of lateral conductor 1132 proximate to side 1070 of device 1000) to surface 1102 of device 1000, and the first vertical conductor is electrically coupled to contact pad 1030. In the illustrated embodiment, the first vertical conductor includes vias 1131. Alternatively, the lateral conductor 1132 may extend to side 1070 of the device 1000, and the first vertical conductor may include conductive material that is coupled to (e.g., deposited on) side 1070 in contact with the lateral conductor 1132, and which extends to surface 1102 and contact pad 1030. Although FIG. 10 depicts six vias 1131 corresponding to the first vertical conductor, other embodiments may include more or fewer vias.

The second vertical conductor extends across ceramic layers 1110-1116 and 1160-1163 from a second side of the lateral conductor 1132 (i.e., the side of lateral conductor 1132 proximate to side 1072 of device 1000) to surface 1102 of device 1000, and the second vertical conductor is electrically coupled to contact pad 1037. In the illustrated embodiment, the second vertical conductor includes vias 1133. Alternatively, the lateral conductor 1132 may extend to side 1072 of the device 1000, and the second vertical conductor may include conductive material that is coupled to (e.g., deposited on) side 1072 in contact with the lateral conductor 1132, and which extends to surface 1102 and contact pad 1037. Although FIG. 10 depicts six vias 1133 corresponding to the second vertical conductor, other embodiments may include more or fewer vias.

The lateral conductor 1132 includes a portion of conductive layer 1130, which extends between and is electrically coupled to the first and second vertical conductors (e.g., vias 1131 and 1133). Essentially, the lateral conductor 1132 is parallel with the electrodes of capacitors 1034 and 1056, and extends in an orthogonal direction from the first and second vertical conductors. According to an embodiment, the lateral conductor 1132 is located below the ceramic material 1117 of capacitor 1056. Accordingly, the lateral conductor 1132 may be considered to be located between capacitor 1056 and conductive layer 1157.

In the illustrated embodiment, the lateral conductor 1132 is formed from the same conductive layer 1130 as the top plate of capacitor 1038, and more specifically the lateral conductor 1132 and the top plate of capacitor 1038 are formed from the same portion(s) of conductive layer 1130. In such an embodiment, the portion(s) of layer 1130 from which lateral conductor 1132 and the top plate of capacitor 1038 are formed has the dual purpose of carrying forward current and functioning as a capacitor electrode. When the elements of capacitor 1038 are configured instead in the form of a conductor-backed transmission line, the portion(s) of layer 1130 from which lateral conductor 1132 are formed primarily functions to carry forward current.

According to an embodiment, the horizontal area occupied by the lateral conductor 1132 may be a continuous portion of conductive layer 1130 (e.g., a sheet) across substantially the entire area of the electrodes of envelope capacitor 1056, except for voids that enable vias 1135 to extend from envelope capacitor 1056 to the ground node (e.g., conductive layer 1157) without being shorted to the lateral conductor 1132. In an alternate embodiment, the lateral conductor 1132 may include a plurality of conductors that extend between and electrically couple vias 1131 and 1133. For example, conductive layer 1130 may be configured as a plurality of transmission lines of a conductor-backed transmission line, where conductive layer 1130 is configured to carry forward current, and conductive layer 1157 is configured as the ground electrode plate.

As FIG. 11 shows and the above description indicates, the forward current path structure (including the first and second vertical conductors (e.g., vias 1131, 1133) and lateral conductor 1132) provides a continuous conductive path between surface 1102 toward side 1070 of device 1000, down and across the span of the lateral conductor 1132, and up to surface 1102 toward side 1072 of device 1000. In other words, the forward current path structure circumscribes most of the relatively low-Q ceramic material 1117 included in $C_{env}$ 1056 (i.e., portions of ceramic layers 1111-1115). Described yet another way, in the embodiment of FIG. 11, the forward current path structure is physically positioned between $C_{env}$ 1056 and the reverse current path 1181 (or between $C_{env}$ 1056 and conductive layer 1157).

During operation, the forward current 1180 travels through the forward current path structure, rather than traveling over the top surface 1102 of device 1000. Although eddy currents still may develop between the reverse current path 1181 and the forward current path 1180, those eddy currents would not significantly impinge upon the relatively lossy ceramic material 1117, and thus those eddy currents would not induce significant losses through the ceramic material 1117. In other words, the forward current path structure substantially eliminates the presence of relatively lossy high dielectric material (e.g., ceramic material 1117) between the device's forward path 1180 and the return current path 1181.

Figure 12:
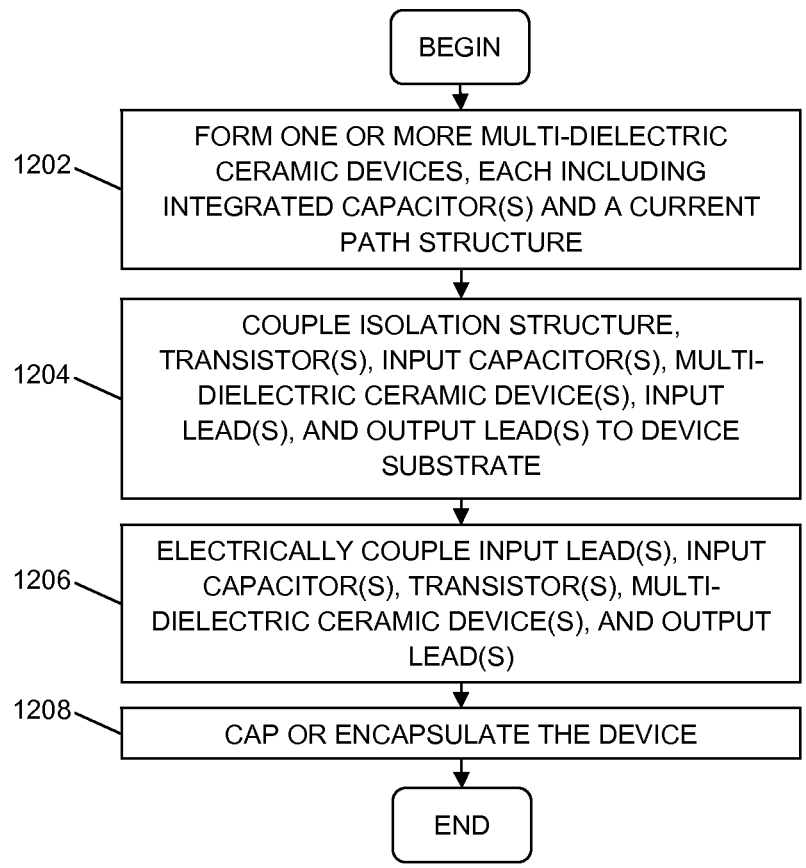
FIG. 12 is a flowchart of a method of manufacturing a packaged RF device with a multi-dielectric ceramic device, in accordance with an example embodiment.

FIG. 12 is a flowchart of a method of manufacturing a multi-dielectric ceramic device (e.g., devices 700, 1000, FIGS. 7-11) and a packaged RF device (e.g., device 200, 500, FIGS. 2, 5) that includes one or more multi-dielectric ceramic devices, in accordance with an example embodiment. The method may begin, in block 1202, by forming one or more multi-dielectric ceramic devices (e.g., devices 700, 1000, FIGS. 7-11). According to an embodiment, to form a multi-dielectric ceramic device, thick- or thin-film capacitor electrodes (e.g., in the form of conductive layers 820-825, 830, 857, 870-873, 1120-1125, 1130, 1157, 1170-1173) may be screen printed onto sheets of dielectric material (e.g., ceramic layers 810-816, 860-863, 1110-1116, 1160-1163 in a green form), where the dielectric material sheets include openings corresponding to via holes. Conductive material is deposited in the via holes, which are aligned to produce vias (e.g., vias 831, 833, 834, 835, 851, 855, 1131, 1133, 1133, 1155) that will interconnect the various conductive layers as intended. The sheets are then aligned and stacked under pressure. The above process alternatively could be described as forming a stack that includes a first electrode, a second electrode, at least one first ceramic layer between the first and second electrodes, a third electrode, a fourth electrode, at least one second ceramic layer between the third and fourth electrodes, and lateral conductor between the first and second ceramic layers, where the at least one first ceramic layer is formed from a first ceramic material that has a first dielectric constant, and the at least one second ceramic layer is formed from a second ceramic material that has a second dielectric constant that is less than the first dielectric constant. The first and second vertical conductors are formed so that they extend from opposite ends of the lateral conductor to a surface of the stack.

The stack is then dried, cut to size, and sintered or "co-fired" (e.g., at temperatures in a range of 1200 degrees Celsius (C) to 1500 degrees C.) to form a monolithic device that includes multiple ceramic capacitors and a conductive current path structure, as previously described. Additional processes may be carried out during fabrication of the multi-dielectric ceramic devices, as would be understood by those of skill in the art, based on the description herein.

In block 1204, for an air cavity embodiment, an isolation structure (e.g., isolation structure 208, FIG. 2) is coupled to a device substrate (e.g., flange 206). In addition, one or more active devices (e.g., transistors 220), input impedance matching circuit elements (e.g., capacitors 214), and multi-dielectric ceramic devices (e.g., devices 700, 1000, FIGS. 7-11) are coupled to a portion of the top surface of the substrate that is exposed through an opening in the isolation structure. Leads (e.g., input and output leads 202, 204, and bias leads 205) are coupled to the top surface of the isolation structure (e.g., to metallization on the top surface of the isolation structure). In an alternate embodiment, a conductive layer on the top surface of the isolation structure may be patterned and etched to form a leadframe (e.g., prior to coupling the isolation structure to the flange). For over-molded (e.g., encapsulated) device embodiments, the isolation structure may be excluded, and the substrate and leads may form portions of a leadframe.

In block 1206, the input lead(s), input capacitor(s), transistor(s), multi-dielectric ceramic device(s), and output lead(s) are electrically coupled together. For example, the electrical connections may be made using bondwires between the various device components and elements, as discussed previously. Finally, in block 1208, the device is capped (e.g., with cap 310) or encapsulated (e.g., with mold compound, not illustrated). The device may then be incorporated into a larger electrical system. For example, the device (or multiple instances thereof) may be incorporated into any of a variety of amplifier systems, including but not limited to a Doherty amplifier, a class A, B, AB, C, D, E or F amplifier, and so on.

As discussed previously, devices in which eddy currents from forward and reverse current paths pass through low-Q material positioned between the forward and reverse current paths may experience significant power losses through the low-Q material at the carrier frequencies. However, embodiments of the inventive subject matter overcome this issue by including a current path structure that circumscribes the low-Q material (e.g., dielectric materials included in $C_{env}$), thus substantially reducing or eliminating losses through that low-Q material.

Figure 13:
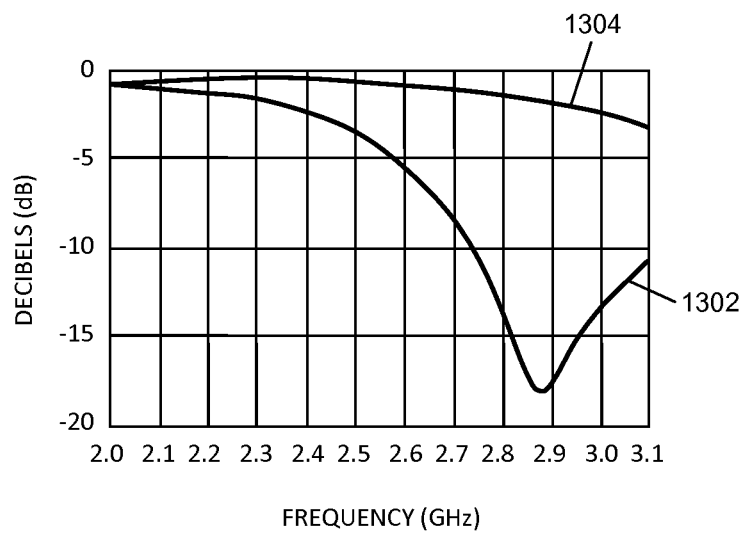
FIG. 13 is a chart comparing device loss across a range of frequencies for a device without a current path structure and a device with a current path structure, according to an embodiment.

FIG. 13 is a chart comparing device power loss across a range of frequencies for a device without a current path structure and a device with a current path structure, according to an embodiment. More specifically, trace 1302 plots an S parameter simulation of a device without a current path structure, indicating power loss exceeding 5 decibels (dB) between frequencies in a range of 2.6 gigahertz (GHz) to 3.1 GHz. Conversely, trace 1304 plots an S parameter simulation of a device with a current path structure, according to an embodiment, indicating significantly less loss within the same frequency range.

An embodiment of a device includes first and second parallel opposed surfaces, and first and second parallel opposed sides extending between the first and second surfaces. The device also includes first and second ceramic capacitors and a conductive current path structure. The first ceramic capacitor is formed from a first stack that includes a first electrode, a second electrode, and at least one first ceramic layer between the first and second electrodes. The at least one first ceramic layer is formed from a first ceramic material that has a first quality factor, and the first and second electrodes are parallel with the first and second surfaces of the device. The second ceramic capacitor is formed from a second stack that includes a third electrode, a fourth electrode, and at least one second ceramic layer between the third and fourth electrodes. The at least one second ceramic layer is formed from a second ceramic material that has a second quality factor, where the second quality factor is higher than the first quality factor. The third and fourth electrodes are parallel with the first and second surfaces of the device. The conductive current path structure includes a lateral conductor, a first vertical conductor proximate to the first side of the device, and a second vertical conductor proximate to the second side of the device. The lateral conductor is parallel with the first and second surfaces of the device, and is located between the first and second ceramic layers. The first vertical conductor extends from a first end of the lateral conductor to the first surface of the device, and the second vertical conductor extends from a second end of the lateral conductor to the first surface of the device. In a further embodiment, the first and second ceramic materials, the first, second, third, and fourth electrodes, and the lateral conductor are co-fired together to form a monolithic device.

An embodiment of a packaged RF amplifier device includes a device substrate that includes a voltage reference plane, an input lead coupled to the device substrate, an output lead coupled to the device substrate, a transistor coupled to the device substrate, and a first output impedance matching circuit coupled to the device substrate. The transistor has a control terminal, a first current carrying terminal, and a second current carrying terminal, where the control terminal is electrically coupled to the input lead. The first output impedance matching circuit is coupled to the device substrate and is electrically coupled between the first current carrying terminal and the output lead. The first output impedance matching circuit includes a multi-dielectric ceramic device that includes first and second parallel opposed surfaces, and first and second parallel opposed sides extending between the first and second surfaces. The device also includes first and second ceramic capacitors and a conductive current path structure. The first ceramic capacitor is formed from a first stack that includes a first electrode, a second electrode, and at least one first ceramic layer between the first and second electrodes. The at least one first ceramic layer is formed from a first ceramic material that has a first quality factor, and the first and second electrodes are parallel with the first and second surfaces of the device. The second ceramic capacitor is formed from a second stack that includes a third electrode, a fourth electrode, and at least one second ceramic layer between the third and fourth electrodes. The at least one second ceramic layer is formed from a second ceramic material that has a second quality factor, where the second quality factor is higher than the first quality factor. The third and fourth electrodes are parallel with the first and second surfaces of the device. The conductive current path structure includes a lateral conductor, a first vertical conductor proximate to the first side of the device, and a second vertical conductor proximate to the second side of the device. The lateral conductor is parallel with the first and second surfaces of the device, and is located between the first and second ceramic layers. The first vertical conductor extends from a first end of the lateral conductor to the first surface of the device, and the second vertical conductor extends from a second end of the lateral conductor to the first surface of the device.

An embodiment of a method of forming an RF device includes forming a stack that includes a first electrode, a second electrode, at least one first ceramic layer between the first and second electrodes, a third electrode, a fourth electrode, at least one second ceramic layer between the third and fourth electrodes, and lateral conductor between the first and second ceramic layers. The at least one first ceramic layer is formed from a first ceramic material that has a first quality factor, and the at least one second ceramic layer is formed from a second ceramic material that has a second quality factor, where the second quality factor is greater than the first quality factor. The method further includes forming a first vertical conductor that extends from a first end of the lateral conductor to a first surface of the stack, where the first vertical conductor is proximate to a first side of the stack, and forming a second vertical conductor that extends from a second end of the lateral conductor to the first surface of the stack, where the second vertical conductor is proximate to a second side of the stack. The method further includes co-firing the stack to form a multi-dielectric ceramic device, where the multi-dielectric ceramic device includes a first ceramic capacitor that includes the first and second electrodes and the at least one first ceramic layer, a second ceramic capacitor that includes the third and fourth electrodes and the at least one second ceramic layer, and a conductive current path structure that includes the lateral conductor, the first vertical conductor, and the second vertical conductor.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A device comprising:
    first and second parallel opposed surfaces;
    first and second parallel opposed sides extending between the first and second surfaces;
    a first ceramic capacitor formed from a first stack that includes a first electrode, a second electrode, and at least one first ceramic layer between the first and second electrodes, wherein the at least one first ceramic layer is formed from a first ceramic material that has a first quality factor, and wherein the first and second electrodes are parallel with the first and second surfaces of the device;
    a second ceramic capacitor formed from a second stack that includes a third electrode, a fourth electrode, and at least one second ceramic layer between the third and fourth electrodes, wherein the at least one second ceramic layer is formed from a second ceramic material that has a second quality factor, wherein the second quality factor is higher than the first quality factor, and wherein the third and fourth electrodes are parallel with the first and second surfaces of the device;
    a conductive current path structure that includes a lateral conductor, a first vertical conductor proximate to the first side of the device, and a second vertical conductor proximate to the second side of the device, wherein the lateral conductor is parallel with the first and second surfaces of the device, and is located between the first and second ceramic layers, the first vertical conductor extends from a first end of the lateral conductor to the first surface of the device, and the second vertical conductor extends from a second end of the lateral conductor to the first surface of the device; and
    one or more additional passive components integrally formed with the device, and electrically connected between the first and third electrodes, wherein the first and second ceramic materials, the first, second, third, and fourth electrodes, the lateral conductor, and the one or more additional passive components are co-fired together to form a monolithic device.

2. The device of claim 1, further comprising:
    a conductive layer over the first surface of the device, wherein the conductive layer forms a portion of a ground node and is configured to be attached to a substrate, wherein the first and second vertical conductors extend across the at least one first ceramic layer from the lateral conductor to the first surface of the device, and wherein the first and second vertical conductors are electrically coupled to the conductive layer.

3. The device of claim 1, further comprising:
    a first contact pad exposed at the first surface of the device and proximate to the first side of the device, wherein the first contact pad is configured to support attachment of a first bondwire to the first contact pad; and
    a second contact pad exposed at the first surface of the device and proximate to the second side of the device, wherein the second contact pad is configured to support attachment of a second bondwire to the second contact pad,
    wherein the first and second vertical conductors extend across the at least one second ceramic layer from the lateral conductor to the first surface of the device, wherein the first vertical conductor is electrically coupled to the first contact pad, and wherein the second vertical conductor is electrically coupled to the second contact pad.

4. The device of claim 1, wherein:
    the first vertical conductor includes a plurality of first conductive vias proximate to the first side of the device; and
    the second vertical conductor includes a plurality of second conductive vias proximate to the second side of the device.

5. The device of claim 1, wherein:
    the first vertical conductor includes conductive material coupled to the first side of the device; and
    the second vertical conductor includes conductive material coupled to the second side of the device.

6. The device of claim 1, wherein the second electrode and the fourth electrode are electrically coupled to a ground node for the device.

7. The device of claim 6, wherein the first electrode and the third electrode are electrically coupled to a radio frequency (RF) cold point node for the device.

8. The device of claim 7, wherein the one or more additional passive components comprise:
an inductor coupled in series with the first ceramic capacitor between the RF cold point node and the ground node; and
a resistor coupled in series with the inductor and the first ceramic capacitor between the RF cold point node and the ground node.

9. The device of claim 8, wherein the resistor is selected from a thick film resistor, a thin film resistor, and a discrete resistor.

10. The device of claim 1, further comprising:
a third ceramic capacitor, wherein the third ceramic capacitor is formed from a fifth electrode plate, a sixth electrode plate, and a third ceramic layer between the fifth and sixth electrode plates, wherein the third ceramic layer is formed from the second ceramic material.

11. The device of claim 1, wherein the first ceramic material has a first dielectric constant in a range of 300 to 2000, and the second ceramic material has a second dielectric constant in a range of 10 to 200.

12. A device comprising:
first and second parallel opposed surfaces;
first and second parallel opposed sides extending between the first and second surfaces;
a first ceramic capacitor formed from a first stack that includes a first electrode, a second electrode, and at least one first ceramic layer between the first and second electrodes, wherein the at least one first ceramic layer is formed from a first ceramic material that has a first quality factor, and wherein the first and second electrodes are parallel with the first and second surfaces of the device;
a second ceramic capacitor formed from a second stack that includes a third electrode, a fourth electrode, and at least one second ceramic layer between the third and fourth electrodes, wherein the at least one second ceramic layer is formed from a second ceramic material that has a second quality factor, wherein the second quality factor is higher than the first quality factor, and wherein the third and fourth electrodes are parallel with the first and second surfaces of the device;
a conductive current path structure that includes a lateral conductor, a first vertical conductor proximate to the first side of the device, and a second vertical conductor proximate to the second side of the device, wherein the lateral conductor is parallel with the first and second surfaces of the device, and is located between the first and second ceramic layers, the first vertical conductor extends from a first end of the lateral conductor to the first surface of the device, and the second vertical conductor extends from a second end of the lateral conductor to the first surface of the device;
a first contact pad exposed at the first surface of the device and proximate to the first side of the device, wherein the first contact pad is configured to support attachment of a first bondwire to the first contact pad, wherein the first vertical conductor extends across the at least one first ceramic layer from the lateral conductor to the first surface of the device and the first vertical conductor is electrically coupled to the first contact pad;
a second contact pad exposed at the first surface of the device and proximate to the second side of the device, wherein the second contact pad is configured to support attachment of a second bondwire to the second contact pad, wherein the second vertical conductor extends across the at least one first ceramic layer from the lateral conductor to the first surface of the device, and wherein the second vertical conductor is electrically coupled to the second contact pad; and
a first conductive layer over the second surface of the device, wherein the first conductive layer is configured to function as a ground electrode plate of a conductor-backed transmission line, and
wherein the third electrode and the lateral conductor are a same conductive element that is configured to carry forward current in the conductor-backed transmission line.

13. A device comprising:
first and second parallel opposed surfaces;
first and second parallel opposed sides extending between the first and second surfaces;
a first ceramic capacitor formed from a first stack that includes a first electrode, a second electrode, and at least one first ceramic layer between the first and second electrodes, wherein the at least one first ceramic layer is formed from a first ceramic material that has a first quality factor, and wherein the first and second electrodes are parallel with the first and second surfaces of the device, wherein the second electrode is electrically coupled to a ground node for the device, and wherein the first electrode is electrically coupled to a second node;
a second ceramic capacitor formed from a second stack that includes a third electrode, a fourth electrode, and at least one second ceramic layer between the third and fourth electrodes, wherein the at least one second ceramic layer is formed from a second ceramic material that has a second quality factor, wherein the second quality factor is higher than the first quality factor, and wherein the third and fourth electrodes are parallel with the first and second surfaces of the device, wherein the fourth electrode is electrically coupled to the ground node, and wherein the third electrode is electrically coupled to the second node;
a multilayer ceramic inductor coupled in series with the first ceramic capacitor between the second node and the ground node, wherein the multilayer ceramic inductor is formed from a plurality of serially-coupled inductor segments formed from multiple conductive layers that are separated from each other by the second ceramic material, wherein a first terminal of the multilayer ceramic inductor is electrically coupled to the first electrode, and a second terminal of the multilayer ceramic inductor is electrically coupled to the third electrode; and
a conductive current path structure that includes a lateral conductor, a first vertical conductor proximate to the first side of the device, and a second vertical conductor proximate to the second side of the device, wherein the lateral conductor is parallel with the first and second surfaces of the device, and is located between the first and second ceramic layers, the first vertical conductor extends from a first end of the lateral conductor to the first surface of the device, and the second vertical conductor extends from a second end of the lateral conductor to the first surface of the device.

14. A packaged radio frequency (RF) amplifier device comprising:
a device substrate that includes a voltage reference plane;
an input lead coupled to the device substrate;
an output lead coupled to the device substrate;
a transistor coupled to the device substrate, the transistor having a control terminal, a first current carrying terminal, and a second current carrying terminal, wherein the control terminal is electrically coupled to the input lead;
a first output impedance matching circuit coupled to the device substrate and electrically coupled between the first current carrying terminal and the output lead, wherein the first output impedance matching circuit includes a multi-dielectric ceramic device that includes first and second parallel opposed surfaces,
first and second parallel opposed sides extending between the first and second surfaces,
a first ceramic capacitor formed from a first stack that includes a first electrode, a second electrode, and at least one first ceramic layer between the first and second electrodes, wherein the at least one first ceramic layer is formed from a first ceramic material that has a first quality factor, and wherein the first and second electrodes are parallel with the first and second surfaces of the device,
a second ceramic capacitor formed from a second stack that includes a third electrode, a fourth electrode, and at least one second ceramic layer between the third and fourth electrodes, wherein the at least one second ceramic layer is formed from a second ceramic material that has a second quality factor, wherein the second quality factor is greater than the first quality factor, and wherein the third and fourth electrodes are parallel with the first and second surfaces of the multi-dielectric ceramic device, and
a conductive current path structure that includes a lateral conductor, a first vertical conductor proximate to the first side of the multi-dielectric ceramic device, and a second vertical conductor proximate to the second side of the multi-dielectric ceramic device, wherein the lateral conductor is parallel with the first and second surfaces of the multi-dielectric ceramic device, and is located between the first and second ceramic layers, the first vertical conductor extends from a first end of the lateral conductor to the first surface of the multi-dielectric ceramic device, and the second vertical conductor extends from a second end of the lateral conductor to the first surface of the multi-dielectric ceramic device;
a first set of bondwires electrically coupled between the first current carrying terminal and the third electrode of the second ceramic capacitor; and
a second set of bondwires electrically coupled between the first current carrying terminal and the output lead.

15. The amplifier device of claim 14, further comprising:
a conductive layer over the first surface of the multi-dielectric ceramic device, wherein the conductive layer forms a portion of a ground node and is attached to the device substrate, wherein the first and second vertical conductors extend across the at least one first ceramic layer from the lateral conductor to the first surface of the multi-dielectric ceramic device, and wherein the first and second vertical conductors are electrically coupled to the conductive layer.

16. The amplifier device of claim 14, further comprising:
a conductive layer over the second surface of the multi-dielectric ceramic device, wherein the conductive layer forms a portion of a ground node and is attached to the device substrate, wherein the first and second vertical conductors extend across the at least one first ceramic layer from the lateral conductor to the first surface of the multi-dielectric ceramic device.

17. A packaged radio frequency (RF) amplifier device comprising:
a device substrate that includes a voltage reference plane;
an input lead coupled to the device substrate;
an output lead coupled to the device substrate;
a transistor coupled to the device substrate, the transistor having a control terminal, a first current carrying terminal, and a second current carrying terminal, wherein the control terminal is electrically coupled to the input lead;
a first output impedance matching circuit coupled to the device substrate and electrically coupled between the first current carrying terminal and the output lead, wherein the first output impedance matching circuit includes a multi-dielectric ceramic device that includes first and second parallel opposed surfaces,
first and second parallel opposed sides extending between the first and second surfaces,
a first ceramic capacitor formed from a first stack that includes a first electrode, a second electrode, and at least one first ceramic layer between the first and second electrodes, wherein the at least one first ceramic layer is formed from a first ceramic material that has a first quality factor, and wherein the first and second electrodes are parallel with the first and second surfaces of the device,
a second ceramic capacitor formed from a second stack that includes a third electrode, a fourth electrode, and at least one second ceramic layer between the third and fourth electrodes, wherein the at least one second ceramic layer is formed from a second ceramic material that has a second quality factor, wherein the second quality factor is greater than the first quality factor, and wherein the third and fourth electrodes are parallel with the first and second surfaces of the multi-dielectric ceramic device, and
a conductive current path structure that includes a lateral conductor, a first vertical conductor proximate to the first side of the multi-dielectric ceramic device, and a second vertical conductor proximate to the second side of the multi-dielectric ceramic device, wherein the lateral conductor is parallel with the first and second surfaces of the multi-dielectric ceramic device, and is located between the first and second ceramic layers, the first vertical conductor extends from a first end of the lateral conductor to the first surface of the multi-dielectric ceramic device, and the second vertical conductor extends from a second end of the lateral conductor to the first surface of the multi-dielectric ceramic device, wherein the first and second vertical conductors extend across the at least one first ceramic layer from the lateral conductor to the first surface of the multi-dielectric ceramic device;
a first contact pad exposed at the first surface of the multi-dielectric ceramic device and proximate to the first side of the multi-dielectric ceramic device, wherein the first vertical conductor is electrically coupled to the first contact pad;

a first set of bondwires electrically coupled between the first current carrying terminal and the first contact pad;

a second contact pad exposed at the first surface of the multi-dielectric ceramic device and proximate to the second side of the multi-dielectric ceramic device, wherein the second vertical conductor is electrically coupled to the second contact pad; and a second set of bondwires electrically coupled between the second contact pad and the output lead.

* * * * *